United States Patent [19]
Hedberg

[11] Patent Number: 5,761,244
[45] Date of Patent: Jun. 2, 1998

[54] SIGNALLING SYSTEM

[75] Inventor: Mats Olof Joakim Hedberg, Handen, Sweden

[73] Assignee: Telefonaktiebolaget L M Ericsson, Stockholm, Sweden

[21] Appl. No.: 352,863

[22] Filed: Dec. 2, 1994

[30] Foreign Application Priority Data

Dec. 3, 1993 [SE] Sweden .................................. 9304025

[51] Int. Cl.⁶ .............................. H04B 3/02; H04L 25/00
[52] U.S. Cl. .......................... 375/257; 375/219; 375/319; 326/86; 326/90
[58] Field of Search ...................... 375/219–220, 375/257–258, 295, 316–319; 326/84, 86, 90; 327/100, 376–377

[56] References Cited

U.S. PATENT DOCUMENTS 4,794,283  12/1988  Allen et al. ............................ 326/68

FOREIGN PATENT DOCUMENTS

| 261 528 | 3/1988 | European Pat. Off. . |
| 315 473 | 5/1989 | European Pat. Off. . |
| 348 894 | 1/1990 | European Pat. Off. . |
| WO82/03737 | 10/1982 | WIPO . |

OTHER PUBLICATIONS

R.C. Frye et al., "Trends in Silicon–on–Silicon Multichip Modules", *IEEE Design & Test of Computers*, Dec. 1993, pp. 8–17.

Y. Nakagome et al., "Sub–1–V Swing Internal Bus Architecture for Future Low–Power ULSI's", *IEEE Journal of Solid–State Circuits*, vol. 28, No. 4, Apr. 1993, pp. 414–419.

B. Gunning et al., "A CMOS Low–Voltage–Swing Transmission–Line Transceiver", *IEEE International Solid–State Circuits Conference*, Paper No. WP 3.7, Feb. 1992, pp. 58–59.

"IEEE Standard for Low–Voltage Differential Signals for SCI (LVDS)", *IEEE Std. P1596.3/D1*, Dec. 1993, pp. 1–28.

*Primary Examiner*—Young T. Tse
*Attorney, Agent, or Firm*—Burns, Doane, Swecker & Mathis, L.L.P.

[57] ABSTRACT

A signalling system adapted for digital signals includes a signal transmitter, a signal receiver and a connection which connects the transmitter to the receiver. The transmitter includes an output buffer which has at least one transistor connected to the lowest level of a signal supply voltage, such as to "0" potential or earth potential. Driving or steering of the transistor in response to a received control signal causes the transistor to switch from a state of high impedance to a state of low impedance which exhibits resistive or at least predominantly resistive properties, such as to form an information-carrying output signal. A first of two series-connected transistors is connected to the lowest level of the signal supply voltage, for instance "0" or earth potential, and the other transistor is connected to the signal supply voltage. A connection conductor on which the information-carrying signal is transmitted is connected between the transistors. The transistors are brought to different states simultaneously, and in a state of low-impedance, the impedance value corresponds to the impedance value (the resistance value) of the connection.

38 Claims, 9 Drawing Sheets

SIGNALLING SYSTEM

BACKGROUND

The present invention relates to a signalling system and then more particularly, but not exclusively, to a signalling system which is adapted for digital-related signals, particularly digital information-carrying signals.

Signalling systems of the kind to which this document relates employ a signal transmitter and a signal receiver to which voltage is applied via a system voltage having a first voltage level, and include a connection extending between the transmitter and the receiver.

The signal transmitter which is adapted to this application includes a drive stage and an output buffer which is connected to one or two conductors belonging to said connection.

The signal receiver includes a terminating circuit which is connected to the connecting conductor or conductors, and one or two receiver circuits.

A fundamental feature of the invention is that a transmitter-related output buffer circuit includes a number of transistors which can be controlled by the drive circuit and to which current is supplied from a supply voltage or supply source.

More particularly, a basic feature of the invention is that the output buffer circuit consists, in a known manner, of two in series connected transistors, connected between a high voltage level and a low voltage level for the digital related output signal.

In order to enable one digital value to be distinguished from an opposite digital value, the invention is also based on the realization that with regard to said digital signal transmission, series-connected transistors of the output buffer will preferably be operated so as to exhibit a high impedance in one state and therewith block the through-passage of current, and to exhibit a low impedance in another state and therewith allow current to pass through. The transition between the aforesaid states generates a voltage or current edge or flank, which is intended to separate one bit of digital information from another bit of digital information.

The time duration between the closest voltage or current edges is designated "pulse".

In the case of digital information-carrying signals, the time duration between the closest voltage or current edges will vary, although this is also referred to as a pulse in the following.

A large number of signalling systems of the aforedefined kind are known to the art, and are also known in a number of different designs with regard to the character of the signal chosen for the interfaces used between transmitter and connection and between the connection and receiver. Certain of these signal characters are also standardized.

Only a few of the systems known to the art will be mentioned as an example of the present standpoint of techniques in this regard and also with regard to the significant properties of the present invention:

LVDS (Low voltage Differential Signal);
ECL (Emitter Coupled Logic), with a positive supply system;
PECL (Pseudo Emitter Coupled Logic);
CML (Current Mode Logic); and
GTL (Gunning Transceiver Logic).

Reference is made to publication IEEE P1596.3, Sep. 9, 1993, for a closer description of the LVDS system, while reference is made to the publication Motorola ECL System Design Handbook for a closer description of the PECL system (the ECL system is a negative system which when shifted up to a +5V supply system or supply voltage gives PECL). Reference is made to publication IEEE/ISSCC 92, WP 3.7, B. Gunning, Xerox PARC for a closer description of the GTL system.

Each of these systems will be described in more detail in the following with reference to FIGS. 1 to 6.

It can be mentioned at this point, however, that the LVDS system is constructed so that when signalling, the current driven through the connection is activated by a control signal by activation of two first transistors included in a buffer circuit. This produces a current pulse and a direction (sense) which generates a positive voltage across a terminating resistance or impedance belonging to the receiver.

When the current driven through the connection is activated by two second transistors which belong to a buffer circuit or are transmitter-related, a low signal is obtained. This produces a current and a direction (sense) which generates a negative voltage across the terminating resistance.

It will be noted in this regard that in addition to the two first and two second transistors, the system also requires two further transistors, of which one is connected to a supply voltage, via the transistor (Cra), and one is connected to "0" potential or earth potential, via the transistor (Crb).

It will also be noted that the two first transistors and the two second transistors are so connected that two-and-two are made conductive through the medium of their respective control signals, to produce a "differential" signal pattern or signalling.

In addition to this "differential" signal pattern, the transistors may, in exceptional cases, be controlled to obtain a "single ended" signal pattern or signalling.

It should be noted in this regard that the system does not include the connection of a transistor to 0-level or earth level, and that the use of four transistors provides a "differential" signal pattern.

There is also used a transmitter-related "constant" supply current which is coupled to the receiver by the transistors that are activatable by said control signal, via the connection conductors.

It can be mentioned here that the transistors Cra and Crb are connected to two internal control circuits which are associated with a drive circuit and of which one functions to adjust the current value "I" so that the current will lie within a given value, for instance a value of about 4 mA, whereas the other control circuit functions to adjust the average value of the signal voltage, so that said voltage will lie within a given value, for instance a value of about 1.2V.

A PECL signalling system includes a signalling pattern which is generated by virtue of the transmitter output circuit being comprised of emitter-outputs for two buffer-circuit-related transistors, which can be operated to produce a "differential" signal pattern.

In this case, four bipolar transistors are used, of which two are assigned to the actual buffer circuit and two are assigned to requisite drive circuit.

One of the transistors in the buffer circuit can be controlled by a transistor in the drive circuit, such that when the latter adopts a first state, the transistor in the buffer circuit is brought to another state, and vice versa.

These transistors are thus controllable two and two for signal transmission.

There is shown. however. here a bipolar solution which can also be effected with the aid of components in CMOS circuits.

The drive stage is provided with a constant current generator.

According to the CML system. signalling is effected with a current-lowering output signal in forming a requisite signal edge. and two output transistors are arranged and mutually connected as a differentiating pair, with a common current source connected to "0" potential or earth potential. The buffer circuit for this pair of transistors acts as a level shifter which shifts the signal down to a lower level. therewith increasing the CM range (Common Mode) of the drive circuit.

The GTL system uses one single drive transistor in the transmitter circuit. although this transistor is connected to a "0" level or earth level. The system uses a positive supply voltage or supply source.

The GTL system is adapted solely for so-called single-ended signalling. and signals on the connection conductor will vary between 1.2 V and 0.4 V for the two logic levels.

Furthermore. the system is constructed to lower only one current level; it provides no adapted output impedance. has no internal termination and is basically adapted for transmitting signals over bus lines.

A general feature of all of the aforesaid earlier known signalling systems is that they shall be able to convert a signal pulse formed in each internal circuit to a signal pulse or a signal structure which is able to transfer simply and reliably pulsated signals on one connection line or lines to a receiver which is able to receive and detect these pulsated signals and convert each of said pulses to an internal-circuit signal pulse applicable to the receiver. This applies particularly to a CMOS-related system or like system.

It will be seen from the earlier described prior art that a single-wire or two-wire connection extends between transmitter and receiver, and that the signalling pattern can be based on the principle of increasing the current or raising the voltage level on one conductor, for a so-called single-ended signal-transmission. or to increase the current or raise the voltage level on one conductor and decreasing or lowering the voltage level on the other conductor, and vice versa, to effect so-called "differential" signal transmission.

It is also known to adapt the interface-related circuits, such as buffer circuits, for the LVDS system to drive signalling, via the transmitter, around one voltage level (1.2 V). and to receive the thus transmitted signals in the receiver when these signals occur within a specific voltage range or a voltage "window" (the CM range; 0 to 2.4 V).

In this case, the signal receiver is sensitive to edge-related voltage variations or voltage jumps (say 0.4 V) occurring within an adapted CM range.

Signal transmission according to the single-ended system requires an edge-related pulsed signal with the surroundings as a reference. such as a "0" level. signal supply voltage and/or supply voltage. This means, in practice. that the system will utilize one conductor and can be used for short signalling distances. and preferably for circuit board or circuit card internal short signalling distances.

Signal transmission according to a "differential" system requires two conductors for a pulse signal. and the receiver evaluates the pulsed information content of the signal so that the difference between occurrent voltages between the pulse-edges carries the signal information. wherewith the reference to the surroundings becomes less important. The system can also be used for longer signal distances or paths. There is nothing to prevent the signals being generated on one circuit card or circuit board and received on another circuit card or circuit board. The cards or boards may have different voltage levels with regard to the supply voltage or the supply system and/or the signal supply voltage.

The following publications describe other systems and techniques.

WO-A1-82/03737

This publication teaches the use of an output buffer which includes series-connected transistors 28 and 30 having a current limiting drive circuit which includes a transistor circuit having transistors 18, 20 and 22.

The information-carrying output signal is assigned selected logic levels. in accordance with an input signal.

The output buffer circuit is shown in this case as two series-connected transistors 28, 30, of which a first transistor 28 is connected to a signal supply voltage in the form of a system voltage, and the other transistor 30 is connected to earth potential.

In this way, the input signal can cause the output signal to switch between a high level. a level corresponding to the system voltage, and a low level.

A signal structure of this kind can be designated CMOS signals or CMOS circuit-related signal.

EP-A2-0,348,894

This publication also discloses a buffer-related circuit arrangement which includes two series-connected transistors 70, 72 connected between a system voltage (Vdd) and an earth potential 73.

In this case, the transistors are of different kinds and the output signal switches between system voltage and earth potential, as a CMOS signal.

U.S. Pat No. 4,794,283

This publication also discloses a buffer-related circuit arrangement which includes two series-connected transistors 50, 52 connected between system voltage (Vdd) 19 and earth potential 23.

The transistors of this arrangement are also of different kinds and the output signal switches between system voltage and earth potential, as a CMOS signal.

EP-A2-0,315,473

This publication also discloses a buffer circuit having two series-connected transistors 20, 42 which are connected between system voltage (Vdd) and earth potential.

The transistors 20, 42 are of different kinds and the output signal switches between system voltage and earth potential, as a CMOS signal.

EP-A1-0,261,528

This publication teaches a circuit having an input connection 11, an output connection 12 and a logic circuit 13.

The circuit 13 includes a first NPN-bipolar transistor 15 connected between the output connection 12 and a reference potential, earth potential, and a second bipolar transistor 14 connected between the output connection 12 and the system voltage.

The output signal switches between system voltage (Vdd) and earth potential.

Bipolar technique cannot be used in accordance with the present invention.

IEEE Design & Test of Computers, December 1993.

The article "Trends in Silicon-on-Silicon Multichip Modules" by Robert C. Fryes, et al. page 15, FIG. 8 and associated text, discloses a driving circuit which includes series-connected transistors and which uses a signal supply voltage below the system voltage.

The driving circuit also utilizes two similar transistors in a series-connection.

IEEE Journal of Solid-State Circuits, Vol. 28, No. 4, April 1993.

In an article "Sub-1-V Swing Internal Bus Architecture for Future Low-Power ULSI's" by Y. Nakagome, et al, there is described and illustrated a signalling system which includes a voltage jump for transmitted information-carrying signals with a swing of 0.6 V between 0.7 V and 1.3 V, where the transmitter circuit is comprised of two series-connected transistors of different kinds.

By "supply voltage" or "system voltage" as used in this description is meant the voltage by which circuit board-related circuits are operated, while by "signal supply voltage" is meant the voltage that drives or operates the transmitter-related buffer circuit and/or preferably also the receiver-related terminating circuit.

The voltage required in the receiver circuit to drive the terminating circuits may be the same as in the transmitter, although voltages which differ therefrom may also be used.

SUMMARY

TECHNICAL PROBLEMS

When considering the known state of the art as described above, it will be seen that a technical problem resides in providing a system which transmits digital-related pulsed signals and which with regard to the transmitter side, and then particularly with regard to the buffer circuit, is able to offer a simple circuit solution to the transists belonging to the buffer to the buffer circuit, and to provide a current-lean function while using a signal supply voltage or signal supply source of low voltage and a voltage value which is below the voltage value of the system voltage or supply voltage, and which will also allow the buffer circuit-related transistors to function as impedance adaptation circuits in relation to the connection.

Another technical problem is one of realizing that a transmitter-related buffer circuit may, by virtue of circuits produced in accordance with CMOS-technology, comprise two or more NMOS-transistors which are related in pairs and which have a connecting conductor connected between a pair of transistors or an individual conductor connected to respective series-connected pairs of transistors.

In addition, a technical problem resides in realizing the simplification that can be achieved in the control of these NMOS-transistors by controlling said transistors with a "differential" signalling process in a similar manner and with two voltage levels.

Another technical problem is one of realizing the circuitry/technical advantages that are associated with the use of similar transistors, or at least transistors which are adapted designed in relation to one another for selected signal transmission.

In addition, a technical problem resides in realizing the simplicity of utilizing a positive signal supply voltage or signal supply source with a voltage level which lies considerably beneath the voltage level of the supply voltage, in combination with transistors activated in the aforesaid manner.

Another technical problem is one of providing with the aid of simple means a signal-transmitting circuit which has a wide working range, i.e. is able to accept wide variations in the control voltage to the transistors belonging to the buffer circuit, such as a variation slightly above the "0" level to, in principle, the level of the supply voltage used, and therewith enable the full control range of the transistor to be used.

It will also be seen that a technical problem is one of enabling NMOS-transistors which are used in normal circuit-switching processes to lower the current to be used in a buffer circuit belonging to the signal transmitter, and to create conditions which will enable these transistors to raise the current.

It will also be seen that a technical problem is one of realizing the advantages that are afforded when a first NMOS transistor having a first connecting conductor (Source or Drain) is connected directly to the signal supply voltage or the signal supply source, and the other connecting conductor is connected directly to a first connecting conductor (Source or Drain) of a second NMOS transistor and also directly to a connecting conductor.

Another technical problem is one of realizing the specific activation that is required for the buffer-related transistors of the transmitter circuit when these transistors shall be capable of switching, in a known manner, from a state of high impedance to a state of low impedance (and also low resistivity) when transmitting signals, and selection of other parameters for the transistor circuit so that a signal change can be discerned in the receiver circuit even when the circuit has been driven voltage-wise in relation to the "0" level or earth level up to or down to the value of the supply voltage.

Another technical problem is one of providing a signalling system which at high transmission speeds, for instance speeds above 50 Mbit/s can use signal supply voltages as low as voltages beneath 1.5 V, preferably beneath 0.8 V, and even more preferably down to the lowest possible voltage.

Another technical problem resides in realizing and considering those variations in signal supply voltage that can be permitted on the basis of variations in chosen transmission speeds, such as a higher voltage at higher transmission speeds and vice versa.

Another technical problem resides in realizing that a low signal supply voltage with an associated low edge-generating signal swing or signal amplitude will give a low signal-noise-ratio with a resultant lower power requirement, whereas a higher signal supply voltage with an associated higher signal swing will give a higher signal-noise-ratio with a resultant higher power requirement, and also in realizing on the basis thereof, while considering circuit-related conditions that a relevant level of signal supply voltage in the transmitter circuit can be chosen in respect of receiver requirements regarding requisite signal-noise-ratios.

A further technical problem is one of creating with the aid of simple means transmitter-related output circuits, and then particularly buffer circuits, which are able to utilize different signal supply voltages and also drive buffer-circuit related transistors such that said transistors, when transmitting one pulse-edge or signal-edge, will switch from high-impedance properties to low-impedance properties (including pronounced resistive properties) and with an adaptation of the transmitter impedance (resistance) to the connection impedance (resistance and capacitance and/or inductance) and the receiver impedance (resistance).

It will also be seen that a technical problem is one of providing a signalling system which will not only provide a solution to one or more of the aforesaid technical problems but which also has the ability to operate at higher bit speeds with regard to digital signals, for instance bit speeds greater than 50 Mbit/s and preferably greater than 100 Mbit/s, and which will enable the transmitter circuit, signal supply voltage, connections and receiver circuit to be adapted to a chosen bit speed.

Another technical problem is one of providing with the aid of simple means a reliable and power-lean signalling system which will enable a relatively low signal supply voltage level to be chosen and applied with small current or voltage differences adapted to bit speeds.

When considering the aforesaid, it will be seen that a technical problem resides in providing a signalling system which can operate with different circuit technologies.

Another technical problem resides in realizing the significance of constructing at least the signal-transmitting drive and buffer circuit from one and the same circuit technology, and of also constructing the signal receiver terminating-circuit and receiver-circuit from one and the same circuit technology, these two technologies not necessarily being the same technology.

A technical problem also resides in providing a signalling system which does not exclusively require the circuits to be constructed from one and the same technology, but which will allow the circuits to be constructed from a number of technologies, such as CMOS-technologies, BiCMOS-technology, GaAs technologies.

When constructing a circuit in accordance with the CMOS-technologies, a technical problem resides in at least creating conditions for achieving the same signal speed as in the BiCMOS-technology or bipolar technology, which provides rapid transmitting and receiving means since the output impedance is low, and therewith create conditions which will enable the speed at which the digital signals are transmitted to be increased.

Another technical problem is one of providing an inventive signalling system with requisite circuit arrangements produced with present-day techniques in accordance with the CMOS-technology while realizing that there is needed in this regard a selected number of NMOS-transistors in the buffer circuits, where one pair of series-connected transistors is required with "single-ended" transmission and two pairs of transistors are required at "differential" signal transmission.

A technical problem resides in the ability to realize the advantages that are afforded by and the adaptation required of a system which utilizes a positive signal supply voltage in both the buffer circuits of the transmission circuit and in the terminating and/or receiving circuits of the receiver circuit.

A technical problem also resides in realizing the advantages afforded by and the adaptation required of a system that includes two buffer-circuit related transistors in "single-ended" signalling and four buffer-circuit related transistors in "differential" signalling, where either one or two of these transistors is/are connected directly to the lowest potential of the signal supply source, normally "0" potential, and with the signalling conductor connected between two transistors that are connected in series between the signal supply voltage and earth potential and/or "0" potential.

A technical problem also resides in anticipating and selecting properties in the circuit arrangement, by providing the drive unit with an environment which suffers less disturbance, by allowing the "0" potential and/or earth potential of the supply voltage to differ from the "0" potential and/or earth potential of the signal supply voltage.

A further technical problem is one of realizing that a higher bit speed will place higher demands on the impedance or resistance adaptation of the receiver circuit, so as to enable power to be utilized to a better extent and to obtain a higher degree of reliability, and that the chosen resistance-dominating values of the transmitter circuit, the impedance (resistance) values of the connection, and the impedance or resistance values of the receiver circuit shall be kept mutually equal and preferably low.

A technical problem also resides in realizing the simplifications and the improved reliability that can be obtained with "differential" signal transmission by allowing the output buffer circuit to include four transistors, two being coordinated and adapted to react or respond to an inverted signal, and two being coordinated and adapted to react or respond to a non-inverted co-phase signal deriving from a circuit internal-related input or control signal, and simultaneously by causing each of said signals to activate and influence a respective one of two buffer-related transistors.

An advantage is afforded when an input or control signal to the transmitter can be supplied through an odd number of signal amplifying and/or signal inverting stages to form the aforesaid inverted signal, and can also be supplied through an even number (including 0) signal amplifying and/or signal inverting stages to form said non-inverted signal, wherein a problem resides in realizing the need to coordinate the inverted signal and the non-inverted signal with the aid of one or more time delay circuits so that said signals will occur simultaneously for simultaneous driving of the transistors belonging to the buffer circuit.

A technical problem also resides in creating and implementing conditions whereby a selected signal supply voltage will produce a digitalized signal voltage on the connection conductor which when not adapted in the receiver can reach the signal supply voltage, and when adapted at both ends of the connection can reach approximately half the value.

A further technical problem resides in selecting the level of the signal supply voltage in accordance with a desired application, and also in permitting the lowest signal supply voltage and/or signal voltage level to be negative.

It will also be seen that a technical problem is one of realizing the need to design and adapt the aforesaid output buffer, and therewith the associated NMOS-transistors, to switch from a state of high impedance to a state of low impedance (a more resistive state) when transmitting a signal-edge, so as to generate a resistance-dominated transmitter impedance which, when necessary, can be series-connected or parallel-connected to a line-related series impedance having pronounced resistive properties, or to a series resistance.

A further technical problem is one of realizing within the aforesaid signalling system the significance of including in the signal receiver a terminating network which exhibits pronounced resistive properties, and adapting in a known manner the chosen transmitter resistance values, the relevant connection (impedance) resistance values, and selected receiver resistance values to achieve optimal or at least essentially optimized signal transmission with small losses.

It will also be seen that a technical problem resides in realizing the advantages that are obtained in the receiver circuit when selecting a very low voltage or voltage level on the information-carrying signal on the connection conductor, with very small signal amplitude.

Another technical problem is one of realizing the need to place the information-carrying, conductor-related signal close to "0" potential or earth potential so as to be able to utilize solely one receiver-related differential stage.

A technical problem is also one of realizing the significance of needing to choose only a lower CM range for the receiver circuit.

Another technical problem is one of constructing a power-lean receiver circuit which will give only small time errors or no time errors at all and which will exhibit power saving resistance-dominating impedance values between conductor and "0" potential or earth potential, or with regard to the signal supply voltage in the case of "differential" signal transmission.

Another technical problem resides in realizing that in the case of the aforesaid signalling system, the aforesaid terminating network in the receiver may be comprised of two transistors, such as one or two NMOS-transistors or the like adapted and designed to include pronounced resistive properties.

Another technical problem is one of realizing the flexibility that is achieved by choosing between different signalling systems and by using in the receiver circuit controllable transistors which can be activated and deactivated by selected control signals, and also in realizing the advantages that can be gained in transceiver communication and the reduction in power that can be expected thereby.

Another technical problem resides in realizing those advantages that are gained in tranciever-communication when buffer-related transistors are used as a terminating network.

Still another technical problem is one of realizing that a signal received via the terminating network shall be allowed to pass a signal amplifying circuit, a signal converting circuit and a gate before appearing on an output conductor as a circuit adapted signal.

It will also be seen that a technical problem resides in the ability to use only one differential stage with good responsiveness in the signal receiver, this stage being adapted for small voltage jumps and for a low voltage level, and also in realizing in particular that such a differential stage can be produced with the aid of CMOS-technologies and includes a pair of PMOS-transistors.

Another technical problem is one of realizing the significance of choosing one terminating network configuration from among several available terminating network configurations when "differential" signalling or when "single-ended" signalling is applied.

A technical problem is also one of providing a signal transmitter where the buffer circuit affords a time delayed or time extended (extended rise time) rising pulse-edge and a similar falling pulse-edge and to control the pulse-edge configuration with the aid of a capacitor and/or parasite capacitors.

In the case of a buffer circuit arrangement which includes different transistors which have different activation times, a further technical problem is one of generating pulse-edges that have different time delays, and also to provide conditions whereby the time configuration of these pulse-edges can be caused to conform to a sinusoidal curve and therewith improve reception in the receiver circuit, owing to the fact that such a curve form will reduce the harmonic spectrum and also disturbing radiation.

It will also be seen that a technical problem resides in realizing those advantages that are gained by lowering the derivative of the current change in the signal supply current when switching within the buffer circuit.

In the case of a special curve form which conforms to a sinusoidal shape, a technical problem resides in realizing the significance of and the advantages gained by delivering control signals to the buffer circuits from one and the same signal chain of signal inverting stages or units.

Another technical problem is one of creating within the signal receiver with the aid of simple means conditions for adapting received signals by the terminating circuit to a selected CM range, i.e. adapting the voltage level of received signals to receiver-related circuits.

Another technical problem is one of adapting the receiving circuit to an energy-lean circuit with the aid of simple means.

Another technical problem is one of creating with the aid of simple means conditions which will enable the two control circuits required in LVDS signalling to be omitted without negatively affecting signal transmission and signal reception.

It will also be seen that a technical problem is one of utilizing one or more of the aforesaid characteristics of the invention in a transmitter/receiver, and a receiver/transmitter, a so-called transceiver.

SOLUTION

With the intention of solving one or more of the aforesaid technical problems, the present invention takes as its starting point a signalling system adapted for digital signals and including a signal transmitter and a signal receiver to which voltage is supplied through a system voltage which is assigned a first voltage level, and also including a connection which connects the transmitter and the receiver and which includes one or two conductors, wherein the signal transmitter includes an output buffer circuit which is connected to said connection and which includes two series-connected transistors which are connected between a voltage adapted for a high information-carrying and digital-related output signal and a voltage adapted for a low information-carrying and digital-related output signal where at least one of said transistors is connected to the lowest signal supply voltage level, such as "0" potential or earth potential.

The invention also employs the known technique of causing the transistor to switch from a state of high impedance to a state of low impedance in response to a control signal received by the transmitter.

The present invention utilizes in a known manner two series-connected transistors of which are first of the two transistors is connected to the lowest level of said signal supply voltage, such as "0" potential or earth potential, and the other of said two transistors is connected to a highest level of a signal supply voltage, wherein the common steering or control of said two series-connected transistors in response to a control signal received by the transmitter is adapted so that said transistors will switch from a state of high impedance to a state of low impedance having resistive or at least predominantly resistive properties, so as to form a flank of an information-carrying output signal.

Furthermore, the conductor of a connection between the transmitter and the receiver for transmitting said information-carrying output signal from the transmitter is connected to the common junction point of the two series-connected transistors.

According to the invention, the voltage adapted for a high information-carrying signal is chosen at a voltage level which lies beneath the first voltage level assigned to the system voltage, and that steering or driving of said transistors in response to a received control signal for forming said information-carrying output signal will cause said transistors to switch from a state of high impedance to a state of low impedance.

According to the invention, when in a state of low impedance, said transistors will exhibit resistive, or at least predominantly resistive properties with the impedance value adapted to an impedance value of the connection, and the series-connected transistors are mutually of the same kind and are steered simultaneously to different states by the control signal.

In accordance with proposed embodiments lying within the scope of the inventive concept, one connection of a first transistor of said two transistors in the buffer circuit belonging to the transmitter circuit is connected to "0" potential and/or earth potential, whereas the other connection is connected directly to said conductor and a first connection for the other transistor, the second connection of which is connected directly to the positive signal supply voltage.

According to one embodiment, the resistance-dominating impedance values of the buffer circuit transistors, optionally with a supplementary resistance, such as a series resistance or parallel resistance, the resistance or impedance value of the connection and the resistance-dominating impedance value of the receiver are the same or generally the same.

The signal supply voltage applied to the second transistor may therefore be below 1.2 V, normally between 0.8 V and 0.4 V.

According to the invention, the choice of the value or level of the signal supply voltage will depend on the receiver requirement of a requisite smallest signal-noise-ratio, including the choice of transmission speed.

The drive and buffer circuits in the transmitter unit are constructed from one and the same technology and the terminating and receiver circuits in the receiving unit are also constructed from one and the same technology, although these technologies are not necessarily the same.

It is particularly preferred that the transistors are manufactured in accordance with CMOS-technology, wherein the transistors used in the buffer circuit will consist in NMOS-transistors.

In the case of this application, an advantage is afforded when the signal supply voltage is connected to the second transistor and is a positive voltage.

According to one preferred embodiment, two series-connected transistors can be used with "single-ended" signalling, while four transistors series-connected in pairs can be used with "differential" signalling.

When using CMOS-technologies, it is proposed that the output buffer circuit will include four NMOS-transistors, two of which are coordinated and adapted to be controlled or steered by an inverted signal, and two of which are coordinated and adapted to be controlled or steered by a non-inverted signal, wherein the two transistors are activated simultaneously by its respective one of said two control signals.

A transmitter to which an input signal or control signal is delivered can be supplied through an odd number of signal amplifying and/or signal inverting stages so as to form said inverted signal, and can also be supplied through an even number (including 0) signal amplifying and/or signal inverting stages to form said non-inverted signal.

The inverted signal and the non-inverted signal are arranged to occur simultaneously in a respective transistor of a pair of included transistors, with the aid of time delay circuits.

An object of the invention is to drive the aforesaid NMOS-transistors with a low level signal supply voltage with the intention of saving energy, and practical applications have indicated that this voltage level may conveniently be lower than 1.0 V, preferably about 0.8–0.4 V.

According to one embodiment of the invention, the output buffer circuit and its transistors are designed and adapted so that when in a driving stage and when signal transmitting a pulse or a pulse-edge, there is formed a selected resistive-dominated transmitter impedance.

In the case of a signalling circuit which is adapted to the best possible extent and which includes transmitter-related and receiver-related NMOS-transistors that are driven as resistance-dominated impedances, the information-carrying output signal on the conductor will be allocated one or more pulse-edge related voltage jumps or current jumps which will at least normally lie beneath the level of the signal supply voltage and which with adapted impedance and/or resistance values will correspond or at least generally correspond to half the signal supply voltage in double termination.

The reference to the effect that the signal receiver shall include a terminating network which exhibits pronounced resistive properties also includes adaptation of the selected impedance (resistance) values to the impedance of the connection.

According to one embodiment of the invention, the terminating network may also be comprised of at least two transistors, which preferably consist in NMOS-transistors in the case of CMOS-technologies.

The signal received in the receiving circuit via the terminating network will preferably be allowed to pass a signal amplifying circuit, a signal converting circuit and a gate prior to the signal appearing on an output line as a circuit adapted signal.

The present invention also includes construction and dimensioning steps related to the signal receiver, in that said signal receiver will also preferably include a differential stage, which is adapted to receive signals with small voltage jumps at low level.

The differential stage is constructed in accordance with CMOS-technologies and comprises a pair of PMOS-transistors.

In the case of "differential" signal transmission, it is also proposed that the terminating network will comprise at least two circuits which exhibit pronounced resistive properties and which are connected between respective conductors of the connection and "0" potential, earth potential, signal supply voltage or supply voltage.

In the case of "single-ended" signal transmission, at least two circuits which exhibit pronounced resistive properties are connected between the conductor of the connection and on one hand "0" potential or earth potential and on the other hand signal supply voltage or supply voltage.

It is also proposed that different arrays of associated transistors in the buffer circuit can be activated with a time delay such that a rising pulse-edge and/or a falling pulse-edge of the information-carrying signal will be delayed time-wise by activating a number of such arrays sequentially.

Thus, delayed or extended pulse-edges are equalized to a sinusoidal configuration with the aid of capacitances.

In the case of a plurality of arrays of successively delayed pairs of transistors, the requisite control signals are taken from one and the same chain of signal inverting stages.

The terminating circuits of the receiver are designed and adapted to enable received signals to lie within a selected low CM range with regard to the receiver circuit.

The invention also includes the use of transmitter/receiver and receiver/transmitter units.

ADVANTAGES

The advantages primarily afforded by a signalling system adapted for digital signals in accordance with the invention is that digital signals can be transmitted at a higher speed and with low energy consumption.

An effective electrical adaptation is achieved by selecting a low signalling level beneath the system voltage, and small current jumps and/or voltage jumps to form the pulse-edges of the digital signals, and a resistance-dominated transmitter impedance generated by transmitter-related transistors adapted to the impedance of the connection and a resistance-dominated receiver impedance.

The requisite transmitter and receiver circuit arrangement is simple and pulse signal transmission is reliable.

The invention also enables respective transmitter and receiver earth references to deviate from one another up to ± supply voltage, by using both drive circuits as the CM range of the receiver circuit.

BRIEF DESCRIPTION OF THE DRAWINGS

The prior state of the art and a number of exemplifying embodiments of signal-transmitting and signal-receiving circuits constructed in accordance with the present invention will now be described in more detail with reference to the accompanying drawings, in which.

DETAILED DESCRIPTION

The LVDS system will now be described in more detail with reference to FIG. 1 and to the time-wise signal variations shown in FIGS. 2 and 3.

The system requires a pulse-transmitting circuit (T), a connection or a transmission means (TL) and a pulse-receiving circuit (R).

The illustrated connection (TL) comprises two lines or conductors with requisite protective circuits (S) which are intended to shield against undesirable discharge currents.

A transistor "Cra" determines the current 'T' to the transmitter circuit (T). The size of the current is determined by the voltage applied to the gate of the transistor "Cra".

The current I passes to earth potential either via two first coordinated transistors or via two second coordinated transistors, and then through a transistor Crb.

In this case, reference is made to a "differential" signal transmission and when a control signal "+A" is applied to the two coordinated transistors, there is generated a high "IH" current level and voltage level which in the receiver circuit (R) results in a positive voltage across a terminating resistance RTd provided in the receiver.

When a control signal "–A" is applied to the two second coordinated transistors, there is generated a low "IL" current level and voltage level, which results in the receiver circuit (R) in a current which gives a negative voltage across the terminating resistance RTd.

Such an LVDS system exhibits properties corresponding to a complementary differential CMOS output signal and is able to drive a current, typically a current of about 3 mA, in both directions across the terminating resistance RTd.

Figure 2:
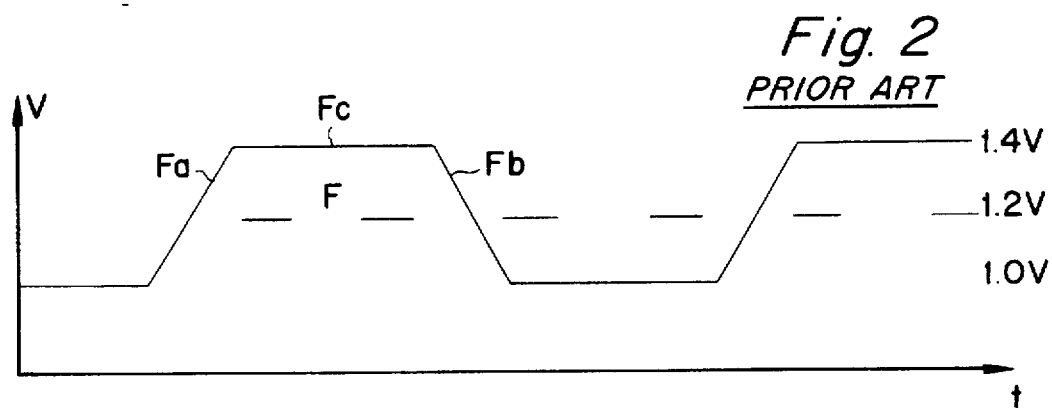
FIG. 2 illustrates a chosen voltage variation between 1.0 and 1.4 V with the intention of illustrating the function of the system shown in FIG. 1 with a "single-ended" signalling principle.
Figure 3:
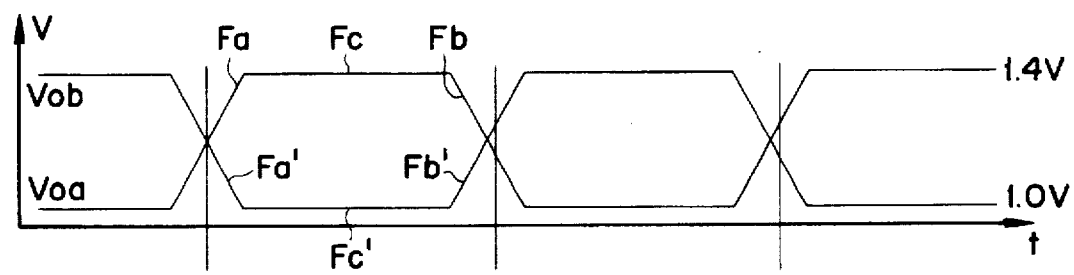
FIG. 3 illustrates a chosen voltage variation between 1.0 and 1.4 V with the intention of illustrating the function of the system shown in FIG. 1 with a "differential" signalling principle.

It should be noted in this regard that the system can be used as a "single-ended" signal system (according to FIG. 2) or as a "differential" signal system (according to FIG. 3).

The chosen drive current I is determined by the transistors Cra and Crb, which may also be adapted to adjust the "Voa" and "Vob" of the signal and the centre line, to about 1.2 V, in accordance with FIGS. 2 and 3.

In the present case, the time variation of the signal characteristic is shown as a digital "1" and a digital "0" with a separating voltage edge with reference to FIGS. 2 and 3, which illustrate that the amplitude of the LVDS signal is 0.4 V, peak-to-peak.

Figure 1:
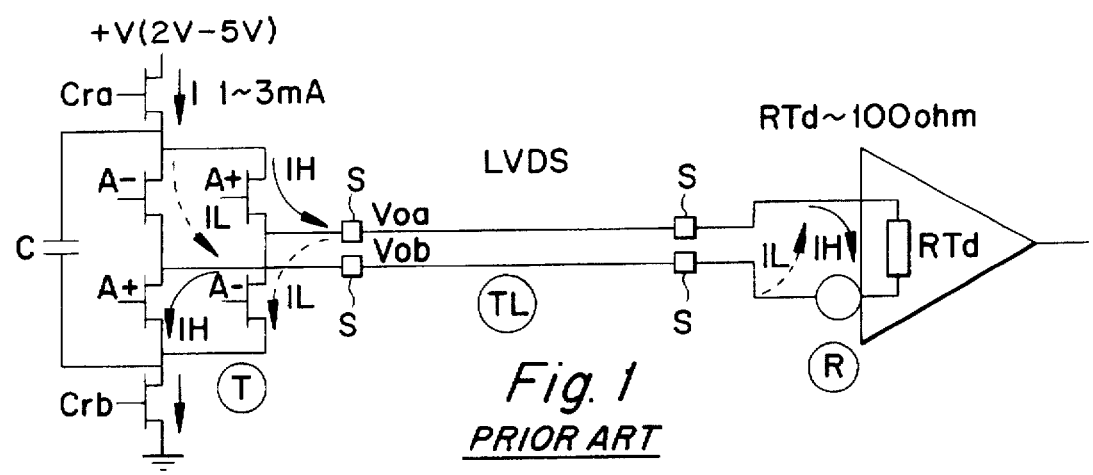
FIG. 1 is a principle circuit diagram of the function of a known LVDS system.

The system illustrated in FIG. 1 can be utilized in CMOS and BiCMOS-technologies and consequently the transistors may be of the NMOS and/or the PMOS type.

It will be noticed in this regard that even though the transistors may have the form of NMOS-transistors and PMOS-transistors. PMOS-transistors require a given high signal supply voltage or drive voltage in order to function, which means that the drive voltage cannot be lowered excessively. The function of a PMOS transistor would probably be jeopardized at voltages beneath 2 V, so as to make it difficult to use such a circuit in practice.

One edge of the signal is referenced "Fa" in FIG. 2, while the nearest adjacent edge is referenced "Fb". The plateau or level of the signal "F" has been referenced "Fc".

In FIG. 3, the edges of the signal have been referenced Fa and Fa', while the other edges of the signal have been referenced Fb and Fb'. The signal levels have been referenced Fc and Fc'.

Figure 4:
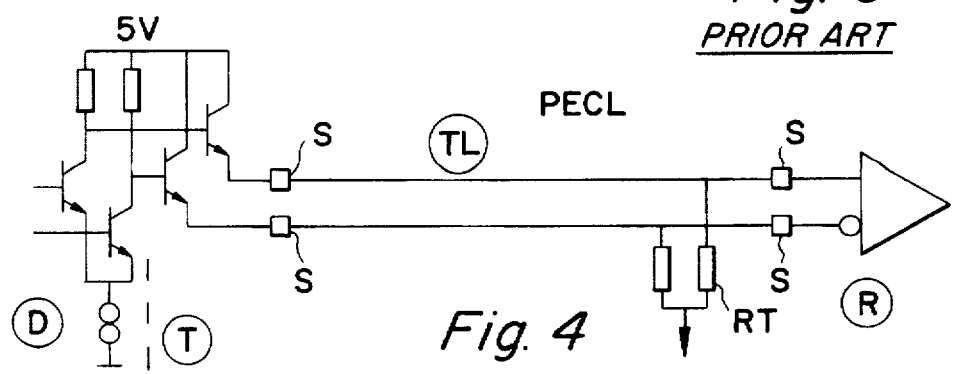
FIG. 4 is a principle circuit diagram illustrating the function of an earlier known PECL system.

FIG. 4 illustrates the principle of an earlier known PECL system, in which the transmitter circuit utilizes the emitter circuits of the two transmitter-related transistors.

In this case, the transmitter circuit (T) is pre-connected by a drive circuit (D) having two transistors and a constant current source connected to earth potential.

This system can also be adapted to CMOS-technology and uses four transistors which are coordinated in pairs such that an input signal or control signal to the drive circuit D will activate two transistors (one in the drive circuit and one in the signal-transmitting circuit or the buffer circuit) so as to drive a current through the connection and through the terminating resistance (the impedance).

Figure 5:
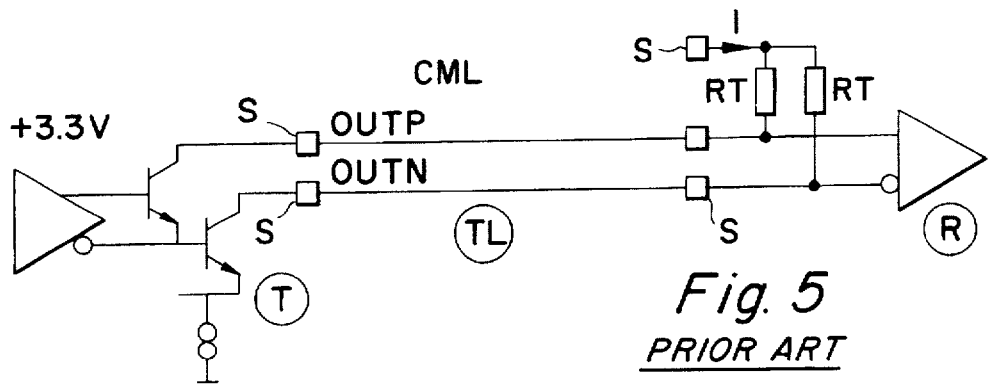
FIG. 5 is a principle circuit diagram illustrating the function of an earlier known CML system.

FIG. 5 is a principle circuit diagram which illustrates the function of a CML system which is essentially the same as that described with reference to FIG. 4, among other things because a constant current source is connected to earth potential.

In this case, however, the collector circuits of the two transistors of the transmitter circuit are each connected to a respective conductor of the connection (TL).

Figure 6:
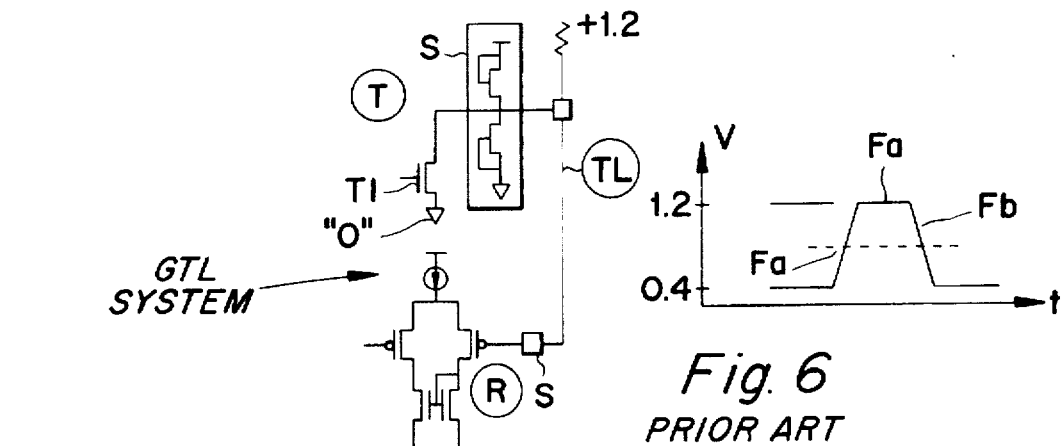
FIG. 6 is a principle circuit diagram illustrating the function of an earlier known GTL system.

With regard to the GTL system shown in FIG. 6, it can be said that the system is comprised solely of one single-ended signalling system with one single transmitter-related transistor, although this transistor is connected directly to "0" potential or earth potential.

This system includes a transmitter (T) and protective circuit (S), a transmission line (TL) and a receiver (R).

The transmitter transistor (T1) is connected to "0" potential or earth potential, and the transistor (T1) switches from a state of high impedance to a state of low impedance having pronounced resistive properties in response to a control signal occurring on "the gate", this change sending a pulse to the receiver (R) over the conductor or line (TL).

In this case, the voltage varies from the signal supply voltage 1.2 V to about 0.4 V, in accordance with the illustrated time diagram for a pulse delimited by the pulse-edges Fa and Fb.

It will also be seen that a system of this kind cannot be adapted to a selected output impedance, and that the current consumption is roughly 20–40 mA.

Signal transmission within this system is effected solely by lowering the chosen signal voltage level (1.2 V) on the connection (TL), and the receiver has no internal termination.

Proposed exemplifying embodiments of an inventive signalling system will now be described with reference to FIG. 7 and to the subsequent Figures with regard to application within the CMOS-technology and with primarily NMOS-transistors.

It is assumed in the following description that the necessary termination values are chosen at 50 ohms, although the person skilled in this field will be aware that termination values other than 50 ohms may also be chosen.

Figure 7:
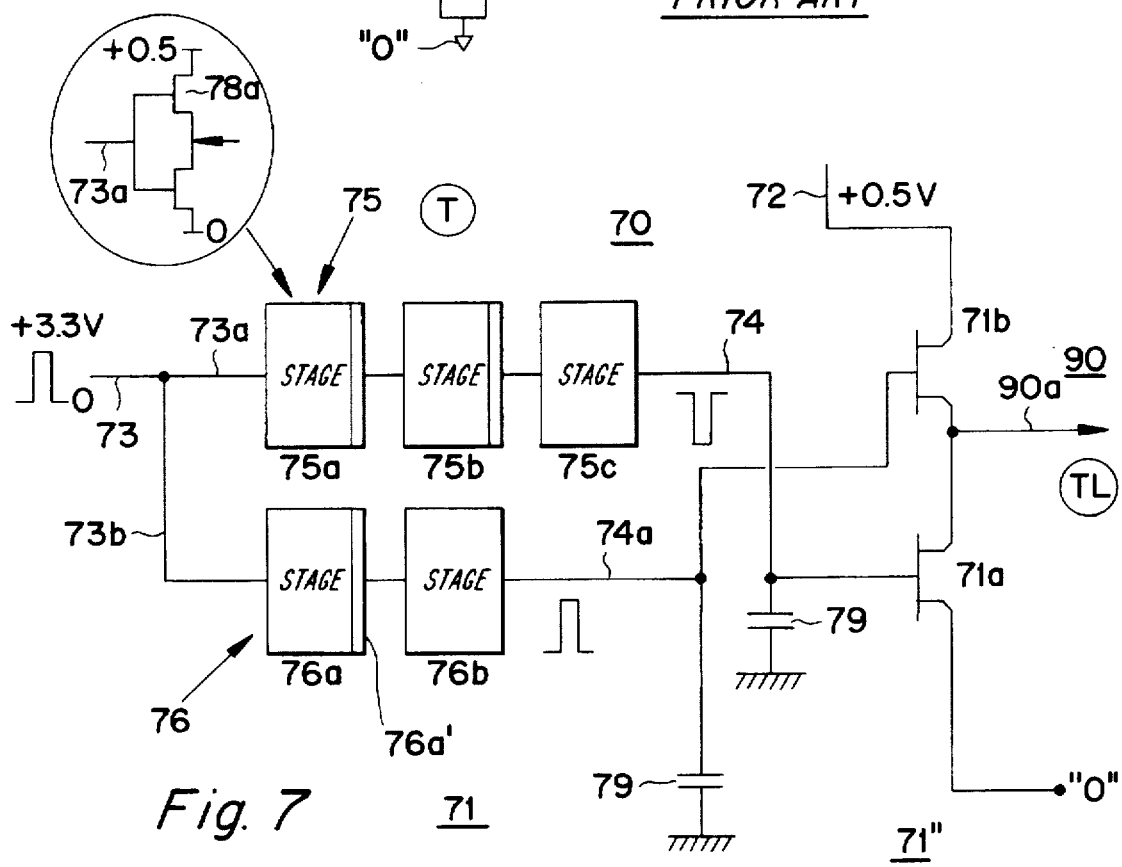
FIG. 7 is a block schematic, partially in detail form, illustrating a signal-transmitting unit constructed in accordance with the inventive principles and adapted for "single-ended" signalling.
Figure 8:
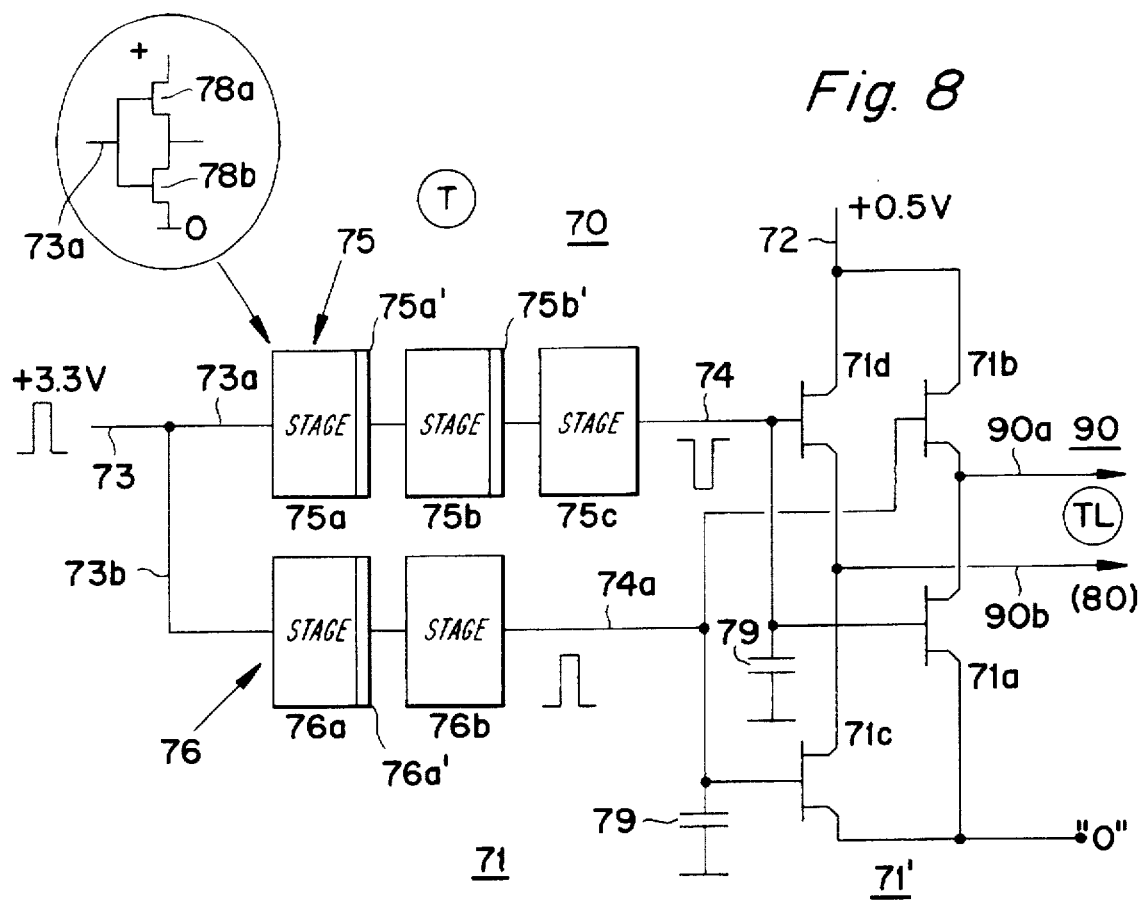
FIG. 8 is a block schematic, partially in detail form, illustrating a signal-transmitting unit constructed in accordance with the inventive principles and adapted for "differential" signalling.

FIG. 7 is a more detailed illustration of the signal transmitting circuit comprised of two buffer-circuit related NMOS-transistors and adapted for single-ended signalling, and FIG. 8 is a more detailed illustration of a signal-transmitting (T) circuit comprised of four buffer-circuit related NMOS-transistors and adapted for differential signalling.

Figure 9:
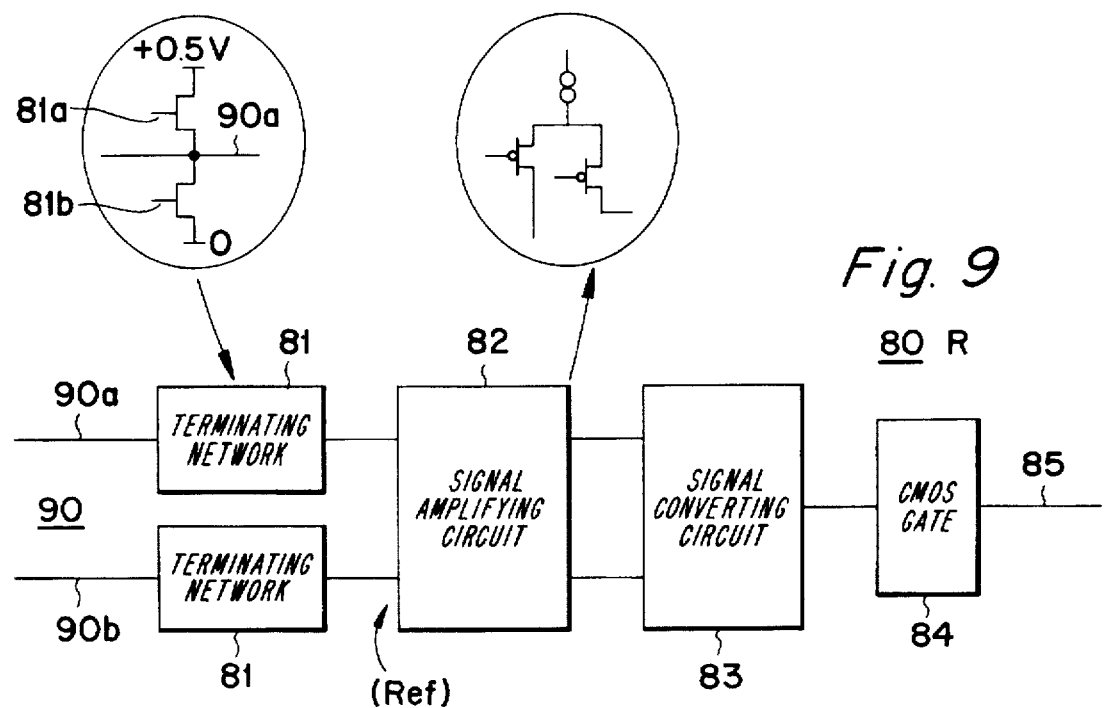
FIG. 9 is a block schematic, in detail form, illustrating a signal-receiving unit constructed in accordance with the inventive principles and adapted to receive signals in "differential" (and also "single-ended") signalling.

FIG. 9 is a block schematic, although partially in detail, which illustrates the signal-receiving (R) circuit primarily adapted for differential signalling. Line 90b with terminating circuit 81 is excluded for single-ended signalling, and a reference voltage (Ref) is applied to the receiver circuit 82.

Thus, there is shown a signalling system which is adapted for digital signals and which includes a signal transmitter (T) 70 and a signal receiver (R) 80, and a connection (TL) 90 which connects the transmitter with the receiver. The transmitter is assigned a drive stage 71 and an output buffer circuit 71', which includes a number, two (according to FIG. 7) or four (according to FIG. 8) NMOS-transistors.

FIG. 7 is intended to illustrate a circuit for single-ended signalling with the transmission line 90 having only one single conductor 90a.

The circuit includes two coordinated transistors 71a, 71b of which a first transistor 71a is connected to "0" potential or earth potential by means of a connection, such as a Source connection, and the other transistor 71b is connected to the highest positive level of the signal supply voltage occurring on the conductor 72 by a second connection, such as a Drain connection.

One connection of the first transistor 71a, such as the Drain connection, is connected directly to the second connection, such as the source connection, of the second transistor 71b, the conductor 90a extending from this connection.

The two NMOS-transistors 71a and 71b are commonly steered or driven in response to a received control signal, a signal generated internally in the circuit, which in the illustrated case is therewith comprised of a CMOS-related signal on a line 73 having an amplitude corresponding to the system voltage or supply voltage, say 3.3 V. This common steering of the transistors is adapted so that one of said transistors will exhibit a state of low impedance having resistance-dominating properties, while the other transistor will exhibit a state of high impedance, and vice versa. This will be illustrated in more detail with reference to FIG. 11, with regard to the chosen impedance values and/or resistance values.

The drive circuit 71 is of similar construction to the drive circuit shown in FIG. 8 and will therefore be described solely with reference to FIG. 8.

When a control signal is received on the conductor 73, a transistor 71a becomes conductive or is closed and exhibits low-impedance properties, while a transistor 71b is opened and therewith exhibits high-impedance properties.

More particularly, in the case of the FIG. 8 embodiment, the selected output buffer 71' includes four NMOS-transistors, of which two (71a and 71d) are coordinated and adapted to react commonly to an inverted signal occurring on a line 74, and the remaining two of which (71b and 71c) are coordinated and adapted to react commonly to a non-inverted signal occurring on a conductor 74a.

Each of the signals on a respective conductor 74 and 74a is intended to activate and influence simultaneously each of the transistor pairs 71a, 71d and 71b, 71c respectively to which respective signals belong.

A transmitter 70 to which an input signal or control signal is delivered on conductor or line 73 can be supplied, via a conductor 73a, through an odd number of signal amplifying and/or signal inverting stages 75 belonging to the drive circuit, said stages being shown as three sequentially connected stages 75a, 75b and 75c, such as to form the inverted signal, and can also be supplied, via a conductor 73b, through an even number (including 0) of signal amplifying and/or signal inverting stages 76 belonging to the drive circuit, this even number of stages 76 being illustrated as two sequentially connected stages 76a and 76b, such as to form said non-inverted signal. All of these stages are coordinated within the so-called drive stage 71 and form said drive stage.

In practice, it is necessary for the inverted signal on the conductor 74a and the non-inverted signal on the conductor 74 to occur simultaneously, which is achieved with the aid of time delay circuits. These time delay circuits are not shown in detail, but may be incorporated in one or more of the aforesaid stages, such as the stage 76a, in the form of a circuit 76a', or in dependence on the design of the circuits 76a and 76b or the circuits 75a–75c.

The signal supply voltage occurring on the conductor or line 72 and driving the NMOS-transistors included in the output buffer circuit 71' is selected at a level below 1.0 V, preferably at a level of about 0.8 V–0.4 V, in the illustrated case 0.5 V.

The aforesaid output buffer 71 and the NMOS-transistors included therein are designed and adapted to form the purest possible "resistive" transmitter impedance in practice, and include a terminating impedance which has pronounced resistive properties and which is connected in the receiver 80, and also includes a corresponding impedance connection, such as to enable signal transmission to be optimized, as will be described later with reference to FIG. 11, and therewith dampen reflections from misaligned end-related circuits, which would otherwise give rise to distorted signals which, in turn, would result in time errors and in increased disturbing radiation.

As a result of this optimation, each signal transmitted by the transmitter will be assigned an edge-formed voltage jump, which will normally be below the signal supply voltage on the conductor or line 72 and which in the case of well-adapted and optimized resistance and/or impedance values will correspond to, or at least essentially correspond to, half the signal supply voltage on the conductor 72.

Each respective signal-inverting stage 75a, 75b, 75c and 76a, 76b respectively is comprised of two transistors 78a and 78b and is connected in accordance with FIG. 7 or 8.

The time delay 75a' and 75b' chosen in stages 75a and 75b shall correspond to the chosen time delay 76a' in stage 76a.

FIG. 9 is a block diagram of the signal receiver (R) 80, wherein certain blocks have been made clearer with a CMOS-adapted circuit solution adapted for "differential" signalling on the conductors or lines 90a, 90b.

It is particularly important in this case that the signal receiver 80 includes a terminating network 81 which exhibits low-impedance resistive properties and which comprises two transistors, preferably two NMOS-transistors, each provided with a connection or conductor 90a, 90b.

The connection of the transistors 81a and 81b shown in FIG. 9 is suitable in the case of single-ended signalling, in order to provide a reference to the non-connected input (Ref) of the receiver circuit 82.

Figure 11:
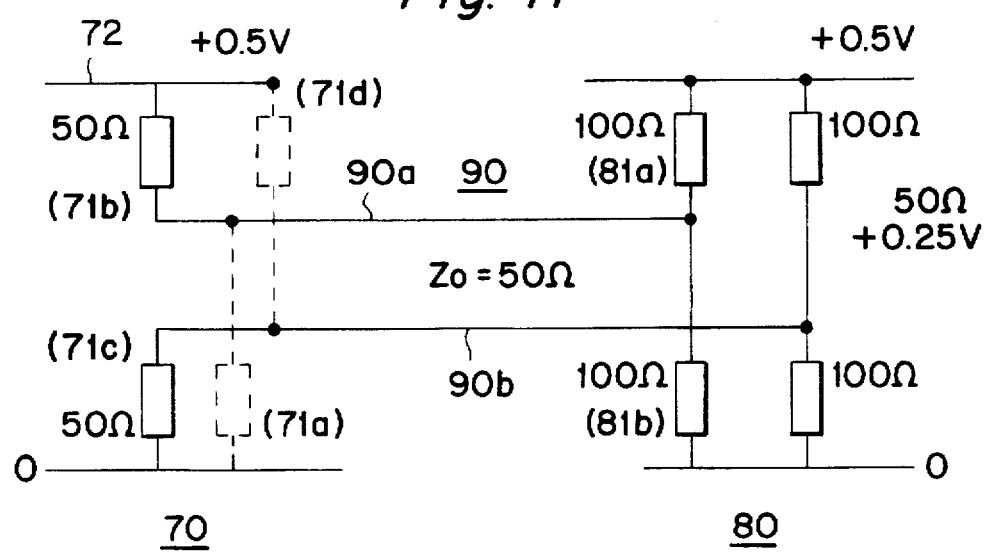
FIG. 11 is a simplified circuit diagram illustrating relevant resistance and/or impedance values in a pulse-generated pulse-edge related signal transmission phase in accordance with the inventive principles in the case of "differential" signalling.

In the case of differential signalling, a transistor for each conductor 90a, 90b may be connected to "0" potential or earth potential, or alternatively to supply voltage or signal supply voltage, although with half the values enumerated in FIG. 11. This results in a power-saving in the receiving circuit without detracting from the requirement of high responsiveness.

A signal received via the terminating network 81 is allowed to pass a signal amplifying circuit 82, a signal converting circuit 83, of known construction, and a CMOS gate 84 of known construction, before appearing on an output conductor 85 as a CMOS-adapted and circuit-internal adapted signal pulse varying between the system voltage level and 0 level.

Figure 10:
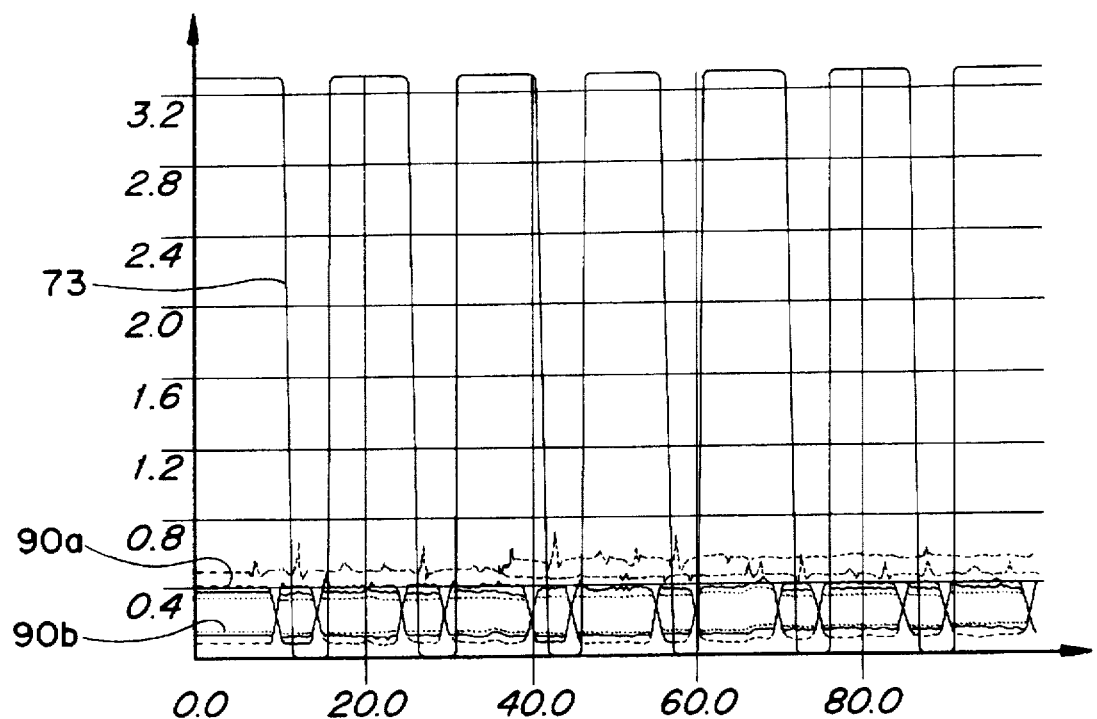
FIG. 10 illustrates the time delay of voltage variations occurring on an input or control line of the transmitter and on the connection.

FIG. 10 illustrates the signal pattern on the two conductors 90a and 90b of the connection 90, where the peak-to-peak voltages forming the mean value vary between 0.15 and 0.35 V, with the mean value lying on 0.25 V.

FIG. 10 also shows the CMOS-adapted input or control signal occurring on the conductor 73.

The CMOS-adapted output signal on the conductor 85 has the same form as the illustrated input signal on the conductor 73.

FIG. 11 illustrates a circuit arrangement in which buffer-circuit related NMOS-transistors activated in the transmitter circuit have a desired resistance and/or impedance adaptation between transmitter-related output circuits and receiver-related input circuits and the impedance of the connection 90. It will be understood that the illustrated state is an idealized state with exemplifying and specific resistance values.

The transistor identification references given in FIG. 8 have also been given in FIG. 11 for clarification purposes.

Figure 12:
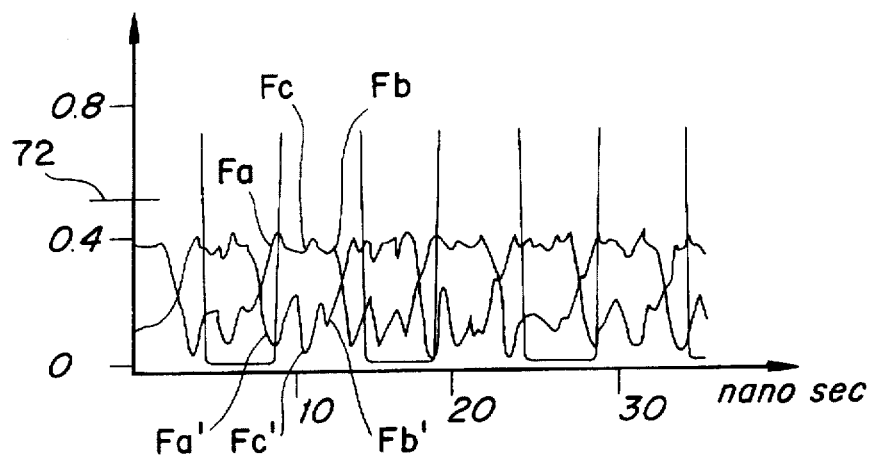
FIG. 12 is intended to illustrate the time-related signal pattern on the connection in "differential"0 signal transmission with low voltage jumps or amplitude.

FIG. 12 illustrates the time-wise signal pattern on the two conductors 90a and 90b of the connection 90 in the case of differential signal transmission with low voltage jumps or amplitudes and low signal-noise ratios.

In this case, the signal jump is between 0.1 and 0.4 V and the signal supply voltage 72 is 0.5 V.

Figure 13:
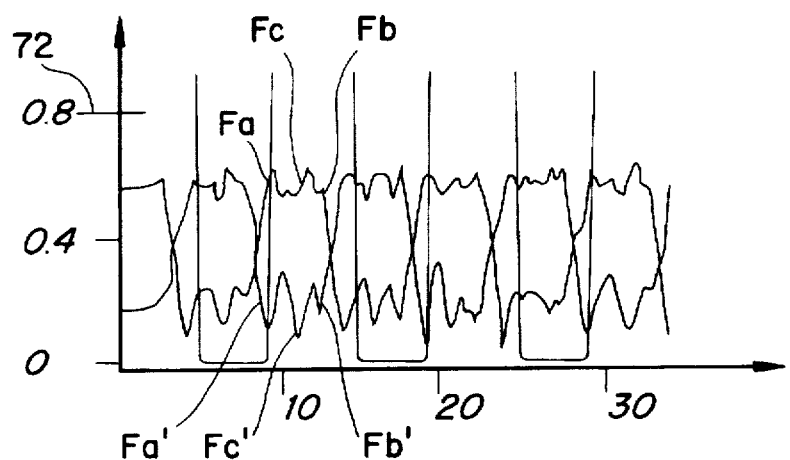
FIG. 13 is intended to illustrate a corresponding signal pattern at a selected higher voltage jump.

FIG. 13 illustrates the time-wise signal pattern on the two conductors 90a and 90b of the connection 90 with a greater voltage jump or amplitude and a higher signal-noise ratio.

In this case, the voltage jump is between 0.2 and 0.6 V and the signal supply voltage 72 is 0.8 V.

The signal-edges or pulse-edges shown in FIGS. 12 and 13 have been identified by the same reference signs as those used in FIG. 3.

Figure 14:
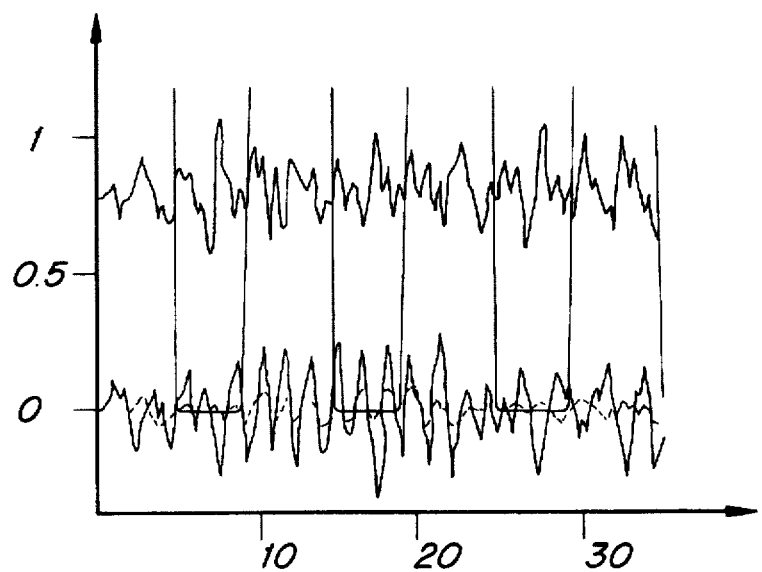
FIG. 14 is intended to illustrate a time-related signal supply voltage and "0" voltage or earth voltage, disturbed by a CMOS circuit.

FIG. 14 illustrates the time-wise disturbed (by CMOS circuits) signal supply voltage 72 with a mean value of 0.8 V. FIG. 14 also illustrates the time-wise variation of "0" potential or earth potential, which is also disturbed by internal circuits.

It will be observed that the illustrated time-wise variations in the pulse and in the voltage are due to circuit-internal switches and can thus vary from case to case.

It is, however, not unusual for occurrent variations in voltage to be smaller than those shown here.

Returning to the receiver circuit 80 shown in FIG. 9, it will thus be seen that this circuit shall be able to receive and to recognize a low information-carrying voltage with small voltage variations and/or 0-transitions.

Accordingly, the receiver 82 may include one single differential stage which may, in turn, include a pair of PMOS-transistors in accordance with known techniques (see FIG. 9).

The differential stage operates in a lower CM range and is therefore less power-demanding and produces less time errors.

By lower CM range is normally meant from "0" to slightly more than half the supply voltage, although levels beneath "0" may occur of course, for instance levels down to −0.6 V.

If the low impedance values having pronounced resistive properties for the transistors should require adjustment, this can be achieved by connecting series resistances or parallel resistances to the conductors 90a and 90b of the connection 90, as explained in more detail below with reference to FIGS. 26 and 27.

Figure 15:
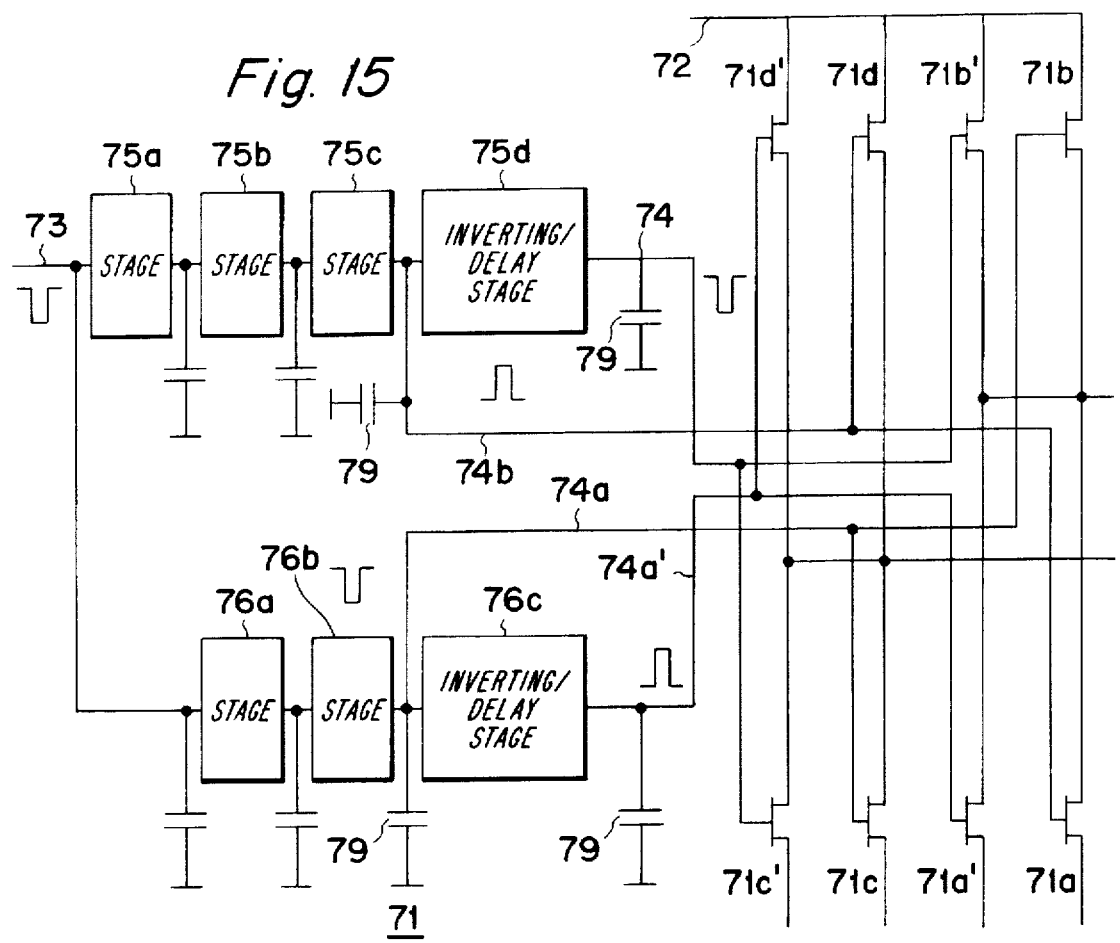
FIG. 15 is a principle circuit diagram illustrating the transistor arrangement of the buffer circuit and the drive circuit in the case of signal transmission with "time extended" pulse-edge time.

FIG. 15 is a principle circuit diagram illustrating a buffer circuit 71', a transistor arrangement and a drive circuit 71 for signal transmission with a "time delay" or a time-extended signal-edge time.

It has been found that when edge-building in accordance with FIG. 7 or 8, the switching time may be excessively short, resulting in a short rise and fall time, wherein generated harmonics produce radiation and impair reception as a result of reflected disturbances.

FIG. 15 illustrates a solution to these problems, in which coordinated pairs of transistors are activated successively.

Figure 16:
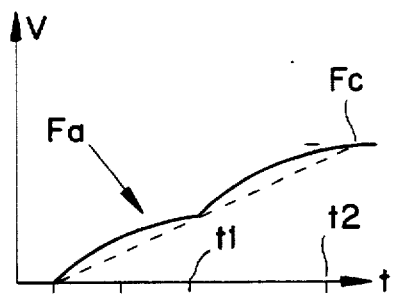
FIG. 16 illustrates a time-related signal pattern for the pulse-edge in a circuit arrangement according to FIG. 15.

According to FIG. 15, the transistors 71a, 71d are activated within a first time section t1, given in FIG. 16, by a pulse occurring on conductors 74, while the transistors 71c and 71b are deactivated at the same time, by a pulse occurring on the conductor 74a.

During a subsequent time section t2, the transistors 71b' and 71c' are deactivated by a pulse on the conductors 74', while the transistors 71d' and 71a' are activated at the same time, by a pulse occurring on the conductor 74a'.

If it is assumed that the transistors in an activated state have a resistance value or impedance value (for instance 100 ohms), the total resistance value from the transmitter circuit will fall to half said value from the time section t1 to the time section t2, with an increase in current through the conductor.

A smoothed or equalized voltage rise caused by activated capacitances 79 has been shown in broken lines in FIG. 16.

The time distance t2–t1 is chosen in an inverting and/or time delay stage, 75d and 76c.

FIG. 16 shows that the signal-edge Fa may be given a somewhat sinusoidal configuration, solely by two-stage activation of selected resistance values or impedance values (100 ohms).

Figure 17:
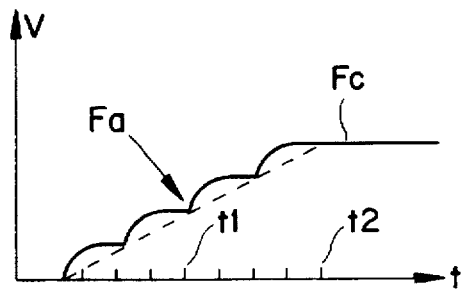
FIG. 17 illustrates a time-related signal pattern and an increased, a doubled, circuit according to FIG. 15.

FIG. 17 shows the form of the signal-edge Fa when using four stages which are mutually delayed to the same extent by a smoothed voltage rise, which can be readily achieved by modifying the circuits shown in FIG. 15, as will readily be understood.

Figure 18:
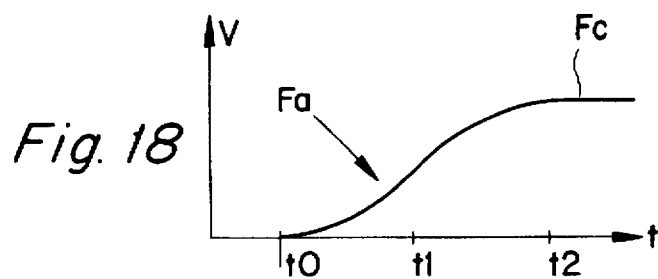
FIG. 18 illustrates an "idealized" signal pattern for the pulse-edge with a further extended circuit according to FIG. 15.

FIG. 18 is intended to illustrate the possibility of forming a more sinusoidal-adapted signal-edge by selecting stages individually from a plurality of existing stages and adapting the time distance between the activation of each individual stage.

Obviously, corresponding measures in a reverse sense will result in a corresponding time extension of the signal-edge Fb, although this is not described in detail.

The circuit arrangement shown in FIG. 15 is thus intended to provide conditions for forming an adapted, slowly rising or falling (although not shown) signal-edge, wherein an impedance value of a transistor pair (say 100 ohms) 71a, 71d, is activated and another transistor pair 71b, 71c is deactivated (results in infinite resistance) whereafter a further transistor pair 71a', 71d', is deactivated and a further transistor pair 71b', 71c', is activated and therewith give in total half the resistance value.

Radiation can be reduced and the inductive effect of the inductive supply can be decreased by a slowly rising or falling flank.

Furthermore, the illustrated capacitances 79 will smooth out voltage variations that occur when forming the signal-edge.

When many time sections are selected (such as illustrated in FIG. 18) the requisite signals to the transistor pairs can be taken from one single chain of inverting stages, 75a–75d and so on.

Figure 19:
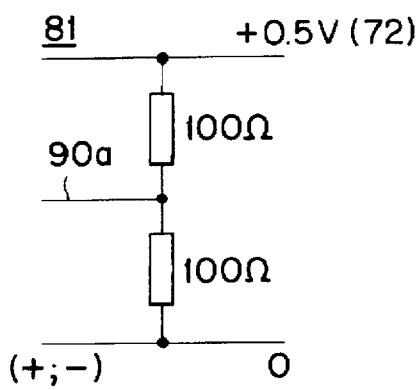
FIG. 19 illustrates a first embodiment of a terminating circuit of a signal receiver.

FIG. 19 illustrates a first exemplifying embodiment of a terminating circuit 81 belonging to a signal receiver 80.

In this case, symmetric 100-ohms resistors or resistances are connected between a signal conductor 90a and earth or "0" potential and the signal supply voltage. In this case, the signal information will occur symmetrically around the mean point of 0.25 V.

It will be observed that the "0" potential need not necessarily be "0" or earth potential, but may also be positive and in some cases even negative, with a corresponding change of the mean point.

Figure 20:
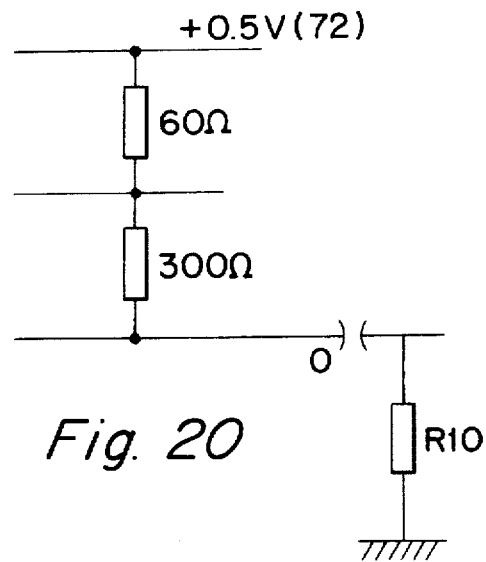
FIG. 20 illustrates a second embodiment of a terminating circuit of a signal receiver.

FIG. 20 is intended to illustrate an asymmetric adaptation in which the chosen 60 ohm resistances and 300 ohm resistances raise the signal information voltage level. The voltage level is lowered at opposite resistance values.

The supply voltage can be used instead of the signal supply voltage (0.5 V) in the case of single-ended signalling and the later activation.

The resistance values chosen may, of course, be varied so as to form different voltages.

Figure 21:
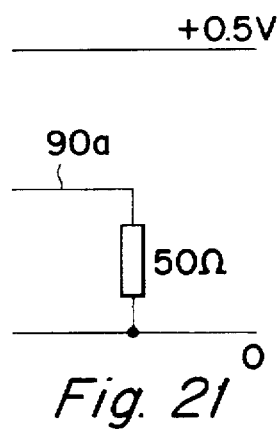
FIG. 21 illustrates a third embodiment of a terminating circuit of a signal receiver.
Figure 22:
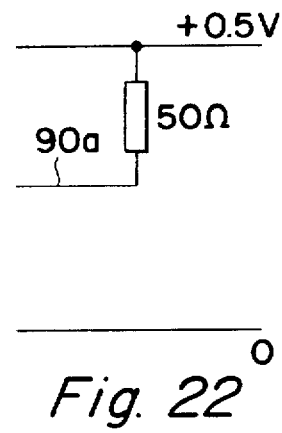
FIG. 22 illustrates a fourth embodiment of a terminating circuit of a signal receiver.

FIG. 21 shows a 50-ohm resistance connected to "0" potential for differential signalling, and FIG. 22 shows a 50-ohm resistance connected to signal supply voltage, such as to relate the signal-information voltage level to "0" potential or to the signal supply voltage level (the supply voltage level).

This adaptation shall be effected in relation to the reception level for which the receiver is designed or adapted.

The terminating circuit illustrated in FIGS. 19–22 may be made circuit-internal or circuit-external.

The circuits illustrated in FIGS. 21 and 22 are also constructed without internal current supply.

It lies within the scope of the invention to replace the resistances shown in the exemplifying embodiments of FIGS. 19–22 with transistors which are driven to a state of low impedance that exhibits preferably pronounced resistive properties, by activating supplementary resistances when necessary.

Figure 23:
FIG. 23 illustrates a first embodiment of a signal receiver.

FIG. 23 is intended to illustrate a first exemplifying embodiment of a signal receiver having an internal reference for the transition or switching voltage or level, where voltage variations occurring on the transmitter side and caused by control signals can be evaluated.

Figure 24:
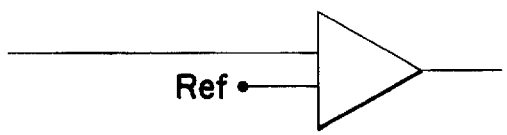
FIG. 24 illustrates a second embodiment of a signal receiver.

FIG. 24 is intended to show that the circuit illustrated in FIG. 23 may include an external voltage reference.

Figure 25:
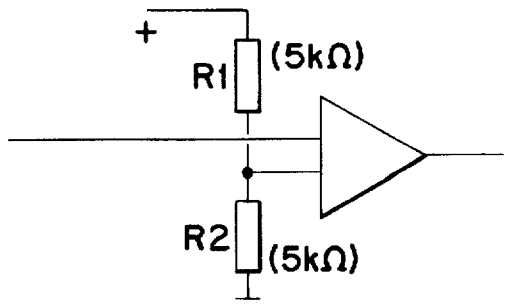
FIG. 25 illustrates a third embodiment of a signal receiver.

FIG. 25 is intended to show that the voltage reference may be related to earth potential or to a voltage value through the medium of high-ohmic resistances R1, R2 having the same or different values.

The non-terminated receivers shown in FIGS. 23–25 may be connected to a selected terminating circuit in accordance with one of FIGS. 19–22, or in accordance with a combination of these Figures.

This presumes that the signal supply voltages in the transmitter and receiver respectively are adapted so that the signal level will lie symmetrically around the transition or switching level of the receiver.

The transmitter signal supply voltage may be the same as or different to the receiver signal supply voltage.

Figure 26:
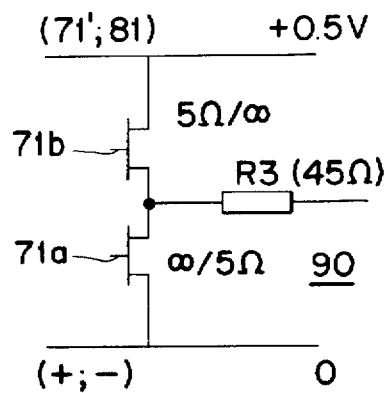
FIG. 26 illustrates a buffer circuit with supplementary resistances according to a first configuration.
Figure 27:
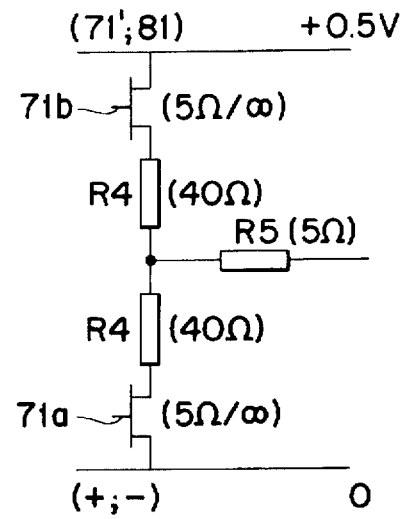
FIG. 27 illustrates a buffer circuit with supplementary resistances according to a first configuration but with resistance values that are different to the values given in FIG. 26.

FIGS. 26 and 27 are intended to illustrate alternatives to the illustrate buffer circuits and/or the illustrated terminating circuits 81.

FIG. 26 shows that the transistors 71a, 71b used provide a low-impedance value of 5 ohms or an infinite impedance, depending on the state chosen, and that a series-resistor R3 (45 ohms) is connected up for the conductor 90 and a receiver adaptation (80), so as to obtain adaptation to the chosen value, for instance 50 ohms.

FIG. 27 shows the transistors 71a, 71b connected in series to a resistance R4 (40 ohms) and a line-related resistance R5 (5 ohms).

The principles of mixing one or more resistances with one or more transistors as shown in FIGS. 26 and 27 may also be applied as a terminating network 81 in the signal receiver 80.

When better process tolerances exist, i.e. are lower with regard to the resistances, it may be beneficial to allow these to be dominating (larger) in relation to the values of the transistors in their activated state, so as to improve the overall tolerance.

It will also be observed that the supply voltage of the drive circuit and the signal supply voltage of the buffer circuit may have differing "0" potentials and/or earth potentials.

The "0" potential may also be connected to earth, or to an earth substrate, over a chosen resistance (R10 in FIG. 20).

It is also possible to lower the signal supply voltage 77 so that said voltage will be displaced in relation to earth potential or "0" potential, for instance between +0.2 V and −0.2 V.

The choice of signal supply voltage is, to some extent, speed-dependent, meaning that the value will preferably be 0.3–0.4 V in the case of certain favourable CMOS-technologies and above 50 Mbit/s, and at a lower level of +0.2 V in the case of higher speeds.

The chosen transmitter supply voltage and receiver supply voltage will not influence signal yield and signal transmission, as will a chosen signal supply voltage.

It also lies within the scope of the invention to enable differential signalling to be effected in relation to a non-terminated receiver circuit, in accordance with FIGS. 23 to 25.

Figure 28:
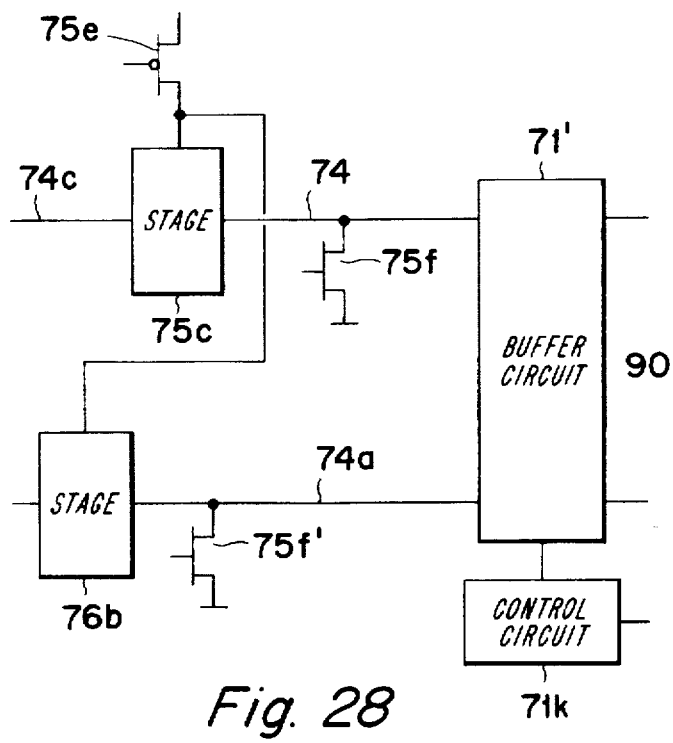
FIG. 28 illustrates a circuit arrangement in which all transistors belonging to the buffer circuit can be steered to a state of high impedance.

FIG. 28 is intended to illustrate a circuit arrangement in which all transistors of a buffer circuit can be steered to a state of high impedance.

To this end, there is used a PMOS transistor 75e which can be brought to a state which exhibits high-impedance properties through the medium of a control signal, wherein the stage 75c and the stage 76b can both take a state in which "0" potential occurs on the conductors 74 and 74a, via activated low-resistive transistors 75f and 75f', which results in that all transistors of the buffer circuit will adopt a state which exhibits high-impedance properties.

When in a state where all transistors of the buffer circuit exhibit high-impedance properties, the selected transistors can be influenced by a separate circuit 71k to exhibit pronounced resistive properties.

These transistors are now so selected as to present requisite resistance-related impedance values to a terminating network.

Figure 29:
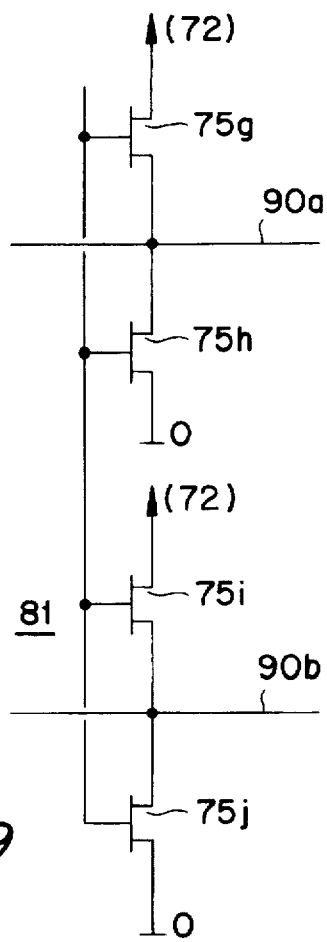
FIG. 29 illustrates a circuit arrangement in which all terminating-related transistors in the receiver can be steered to a state of high impedance.

FIG. 29 is intended to illustrate a circuit arrangement in which all transistors belonging to the terminating network 81 in the receiver 80 can be steered to a state of high impedance.

To this end, control signals are delivered to the transistors 75g, 75h, 75i and 75j which bring the transistors to a state of high impedance.

Supplementary resistances and/or impedances can be activated in the manner earlier described.

Figure 30:
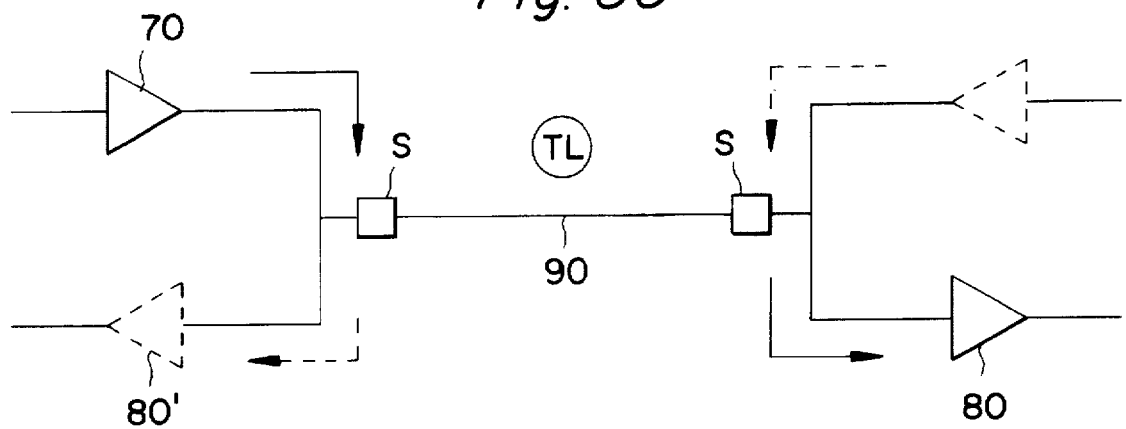
FIG. 30 is a simplified circuit diagram of a transmitter/receiver, receiver/transmitter (transceiver) in which the inventive principles can be applied.

FIG. 30 is a simplified circuit diagram of a transmitter/receiver unit (transceiver), in which the buffer circuits/terminating network (or without) described in accordance with the invention can be used.

The transmitter 70 is in a transmitting mode with the receiver 80, through the connection 90, and a receiver 80' may be blocked against signal reception or open for signal reception.

In this regard, buffer-circuit related transistors (71a', 71b' and 71c', 71d' respectively) may be included to form an adapted terminating network.

This network is connected on the signal-receiving sides.

Figure 31:
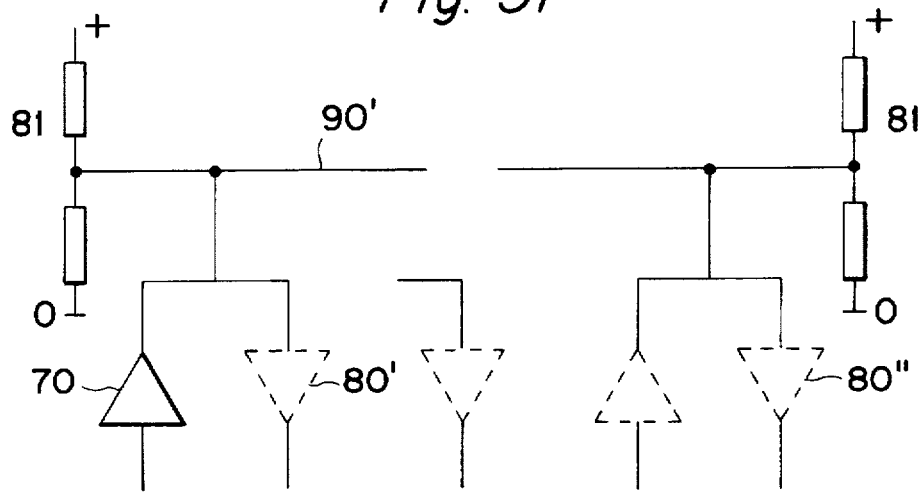
FIG. 31 illustrates the application of the inventive principles on a bus conductor system with termination at both ends.

FIG. 31 illustrates the inventive principles applied to a bus conductor 90' having an adapted termination 81 at both ends. Similar to the FIG. 30 embodiment, a transmitter 70 is able to send information-carrying signals to one or more receivers 80' and/or 80".

The terminating network 81 could also be a circuit-internal network for a receiver.

Figure 32:
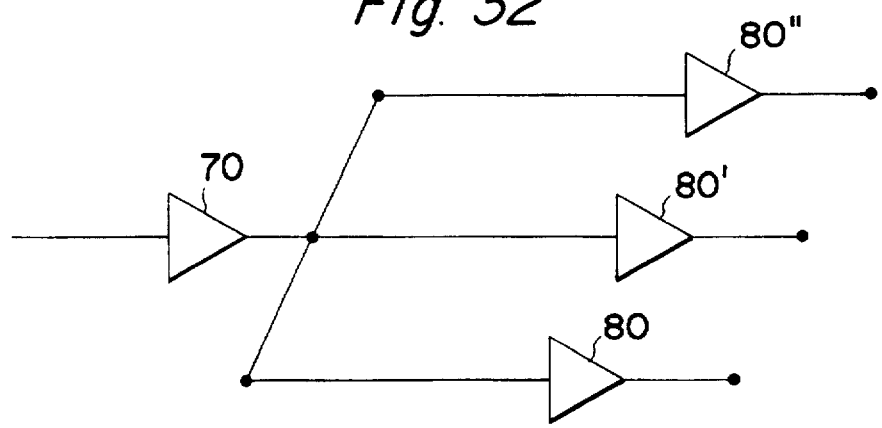
FIG. 32 illustrates a circuit arrangement in which a transmitter is adapted to transmit information-carrying digital signals parallel to a plurality (three) of receivers, and with which the inventive principles can be applied.

FIG. 32 illustrates a circuit arrangement in which a transmitter 70 functions to transmit information-carrying digital signals parallel to a number (three) of receivers 80, 80', 80", where the inventive principles can be applied.

This provides conditions whereby the signals can be branched out to a contemplated distribution network.

23

This requires increase in drive capacity and a decrease in output impedance, in order to maintain the signal level (see also FIG. 31).

A disconnectable drive unit, according to FIG. 28, may also be used in a drive unit where a variable drive capacity is desired.

When two buffer circuits having different drive capacities are available, one with a single-drive capacity, FIG. 8, (or 50 ohms) and one with another drive capacity, such as a double-drive capacity (or 25 ohms), the drive capacity can be varied in four stages 0, 1, 2, 3 times, Zut=infinity, 50 ohms, 25 ohms or 17 ohms, by combining said drive capacities.

Naturally, further stages may be added as a simple supplementary measure.

In the aforegoing, and also in the following claims, the expression "resistive" properties has been used for the purpose of clarifying significant properties of the invention and in defining a particular stage of selected transistors.

In addition to a normal interpretation of chosen expressions, the expressions shall also be given a special interpretation.

Thus, it lies within the scope of the application of the invention that selected voltage values for the transistors used shall be adapted mutually so that the linear resistive component between the Drain connection and Source connection will dominate.

More particularly, this implies that the resistance value of NMOS-transistors will be constant, or at least generally constant, at a varying voltage.

It will be understood that the invention is not restricted to the aforedescribed and illustrated exemplifying embodiments thereof and that modifications can be made within the scope of the inventive concept as defined in the following Claims.

What is claimed is:

1. A signalling system adapted for digital signals including a signal transmitter and a signal receiver to which voltage is supplied via a system voltage assigned a first voltage level, and a connection which connects the transmitter to the receiver;

wherein the signal transmitter is assigned an output buffer circuit which includes two series-connected transistors connected between a supply voltage adapted for a high information-carrying digital-related output signal and a supply voltage adapted for a low information-carrying digital-related output signal;

one of the transistors is connected to a lowest level of a signal supply voltage, and the other transistor is connected to a highest level of the signal supply voltage;

one end of a conductor of the connection functioning to transmit the high or low information-carrying signals is connected in between the transistors;

the signal supply voltage adapted for the high information-carrying signal is selected with a voltage level below the first voltage level of the system voltage;

driving of the transistors in response to a control signal such as to form an information-carrying output signal causes the transistors to switch from a state of high impedance to a state of low impedance;

when in the state of low impedance, the transistors are driven to exhibit at least predominantly resistive properties with an impedance value adapted to a connection impedance value;

the series-connected transistors are of mutually the same type; and the control signals are adapted to drive one transistor to the state of high impedance and the other transistor to the state of low impedance.

2. The signalling system of claim 1, wherein one connection of a first one of the transistors is connected to at least one of "0" potential and earth potential, whereas a second connection of the first transistor is connected to the conductor and a first connection of a second one of the transistors, a second connection of which is connected to a positive signal supply voltage; and both transistors are constructed to change their states simultaneously in response to received control signals.

3. The signalling system of claim 1, wherein the impedance values of the transistors, an impedance value of the connection, and a signal receiver impedance value are substantially the same.

4. The signalling system of claim 1, wherein the signal supply voltage applied to the other transistor is below 1.5 V.

5. The signalling system of claim 4, wherein the signal supply voltage is chosen in accordance with receiver demands for a smallest signal-noise-ratio.

6. The signalling system of claim 1, wherein mutually the same technologies are chosen for signal-transmitting drive and buffer circuit; and mutually the same technologies are chosen for signal-receiving terminating and signal receiver circuits.

7. The signalling system of claim 1, wherein the transistors are produced in accordance with CMOS-technologies.

8. The signalling system of claim 1, wherein the transistors are NMOS-transistors.

9. The signalling system of claim 1, wherein the signal supply voltage applied to the other transistor is a positive voltage.

10. The signalling system of claim 1, wherein the two series-connected transistors are used for signal-ended signalling; and four pair-wise series-connected transistors are used for differential signalling.

11. The signalling system of claim 1, wherein the output buffer circuit includes at least two NMOS-transistors, at least one of which is coordinated and adapted to be controlled by an inverted control signal, and at least one of which is coordinated and adapted to be controlled by a non-inverted control signal; and the two control signals are intended to activate and influence simultaneously respective transistors.

12. The signalling system of claim 11, wherein an input signal delivered to the transmitter is supplied by an odd number of at least one of signal amplifying stages and signal inverting stages such as to form the inverted control signal, and is supplied by an even number (including 0) signal amplifying and/or signal inverting stages, such as to form the non-inverted control signal.

13. The signalling system of claim 12, wherein the inverted control signal and the non-inverted control signal can be caused to occur simultaneously with the aid of time delay circuits.

14. The signalling system of claim 11, wherein the signal supply voltage for driving through the NMOS-transistors is below 1.0 V, preferably about 0.8–0.4 V.

15. The signalling system of claim 11, wherein the transistors can be actuated with a time delay such as to delay or extend at least one of a rising edge and a falling edge of the high or low information-carrying signal.

16. The signalling system of claim 15, wherein the delayed signal-edge is equalized to a sinusoidal form with capacitances.

17. The signalling system of claim 15, wherein control signals for a plurality of pairs of successively time-delayed transistors are taken from a chain of signal-inverting stages.

18. The signalling system of claim 1, wherein the output buffer circuit, based on the transistors, forms a chosen resistance-dominated transmitter impedance in signal transmission.

19. The signalling system of claim 1, wherein the high or low information-carrying signal is assigned one or more edge-related voltage jumps or current jumps which at the adapted impedance values at least generally correspond to half the signal supply voltage.

20. The signalling system of claim 1, wherein the signal receiver includes a terminating network which exhibits pronounced resistive properties.

21. The signalling system of claim 20, wherein the terminating network comprises at least two transistors, preferably two NMOS-transistors.

22. The signalling system of claim 20, wherein a signal received via the terminating network is allowed to pass a signal amplifying circuit, a signal conversion circuit, and a gate prior to the signal occurring on an output conductor as a circuit-adapted signal.

23. The signalling system of claim 20, wherein for differential signal transmission, the terminating network comprises at least two circuits which exhibit pronounced resistive properties and which are connected between respective conductors of the connection and "0" potential, earth potential, signal supply voltage or supply voltage.

24. The signalling system of claim 20, wherein for signal-ended signal transmission, the terminating network comprises at least two circuits which exhibit pronounced resistive properties and which are connected between a connection conductor and, on one hand, at least one of "0" potential and earth potential, and on the other hand, at least one of the signal supply voltage and supply voltage.

25. The signalling system of claim 1, wherein the signal receiver includes a differential stage which is adapted to receive signals with small voltage jumps and with low voltage levels.

26. The signalling system of claim 25, wherein the differential stage is comprised of one pair of PMOS-transistors.

27. The signalling system of claim 1, wherein the said receiver includes terminating circuits that are adapted to receive signals which lie within a selected CM-range of the signal receiver.

28. The signalling system of claim 1, which includes a first transmitter/receiver unit, a transmission conductor and a second receiver/transmitter unit, wherein the transmitter includes a buffer circuit having two series-connected low-impedance and conductor-adapted transistors.

29. The signalling system of claim 28, wherein the transmitter includes four transistors which are series-connected in pairs.

30. The signalling system of claim 28, wherein the transmitter includes further pair-wise series-connected transistors to form a pulse-edge of long rise time.

31. The signalling system of claim 28, wherein the transistors belonging to the buffer circuit are intended to adopt high-impedance values in response to the control signal, so as to block the signal transmitter circuit.

32. The signalling system of claim 31, wherein the buffer-circuit transistors belonging to a selected transmitter are activated by a further circuit to exhibit low-impedance and resistance-dominating values such as to form an adapted terminating network, when receiving signals in an adjacent receiver.

33. The signalling system of claim 31, wherein a number of receiver/transmitter units are connected to a bus conductor, and the bus conductor includes a terminating network.

34. The signalling system of claim 33, wherein at least one terminating network comprises a circuit-internal network for a signal receiver.

35. The signalling system of claim 28, wherein a terminating network included in the signal receiver circuit and having transistors which exhibit pronounced resistive properties can be activated and deactivated by a control signal.

36. The signalling system of claim 35, wherein deactivated transistors give high-impedance values, wherewith the signal receiver exhibits non-terminated properties.

37. The signalling system of claim 1, wherein the control signal functions to activate a further transistor.

38. The signalling system of claim 1, wherein at least one of the transmitter and the receiver includes buffer-circuit related or terminating network-related transistors which are coordinated to an array having a first drive capacity, and an array having a second drive capacity; and these arrays can be combined in response to control signals.

* * * * *